US009690196B2

(12) United States Patent
Ng et al.

(10) Patent No.: US 9,690,196 B2
(45) Date of Patent: Jun. 27, 2017

(54) PHOTOIMAGEABLE COMPOSITIONS CONTAINING THERMAL BASE GENERATORS

(71) Applicant: PROMERUS, LLC, Brecksville, OH (US)

(72) Inventors: Hendra Ng, Brecksville, OH (US); Sridevi Kaiti, Brecksville, OH (US)

(73) Assignee: PROMERUS, LLC, Brecksville, OH (US)

( * ) Notice: Subject to any disclaimer, the term of this patent is extended or adjusted under 35 U.S.C. 154(b) by 0 days.

(21) Appl. No.: 14/982,672

(22) Filed: Dec. 29, 2015

(65) Prior Publication Data

US 2016/0187775 A1 Jun. 30, 2016

Related U.S. Application Data

(60) Provisional application No. 62/097,706, filed on Dec. 30, 2014.

(51) Int. Cl.
*G03F 7/039* (2006.01)
*G03F 7/022* (2006.01)
*G03F 7/023* (2006.01)
*G03F 7/075* (2006.01)
*G03F 7/40* (2006.01)

(52) U.S. Cl.
CPC ............ *G03F 7/0395* (2013.01); *G03F 7/023* (2013.01); *G03F 7/0226* (2013.01); *G03F 7/0233* (2013.01); *G03F 7/039* (2013.01); *G03F 7/0397* (2013.01); *G03F 7/0751* (2013.01); *G03F 7/40* (2013.01)

(58) Field of Classification Search
None
See application file for complete search history.

(56) References Cited

U.S. PATENT DOCUMENTS

| 6,991,893 B2* | 1/2006 | Goodner .................. G03F 7/09 430/313 |
| 2009/0155718 A1* | 6/2009 | Chen ..................... G03F 7/0045 430/283.1 |
| 2011/0070543 A1 | 3/2011 | Knapp et al. |
| 2011/0262872 A1* | 10/2011 | Yokoya ................. G03F 7/0035 430/326 |
| 2012/0129101 A1 | 5/2012 | Onishi et al. |
| 2013/0017488 A1* | 1/2013 | Onishi .................... C08F 32/08 430/280.1 |
| 2014/0087293 A1* | 3/2014 | Kandanarachchi ... C08F 232/08 430/13 |
| 2015/0050596 A1* | 2/2015 | Wu ....................... G03F 7/0005 430/287.1 |

FOREIGN PATENT DOCUMENTS

| CA | 2243727 a1 * | 7/1999 |
| WO | WO 2013/010190 A2 | 1/2013 |

OTHER PUBLICATIONS

Tsong-Shin Jean et al., "Silicon Containing Photoresists," Journal of Photopolymer Science and Technology, vol. 14, No. 3, 2001, pp. 503-506.
Hendra Ng et al., PCT/US2015/067857, Written Opinion of the International Searching Authority.

* cited by examiner

*Primary Examiner* — Cynthia Hamilton
(74) *Attorney, Agent, or Firm* — Balaram Gupta

(57) ABSTRACT

Embodiments in accordance with the present invention encompass positive-tone, aqueous developable, self-imageable polymer compositions useful for forming films that can be patterned to create structures for microelectronic devices, microelectronic packaging, microelectromechanical systems, optoelectronic devices and displays.

20 Claims, 2 Drawing Sheets

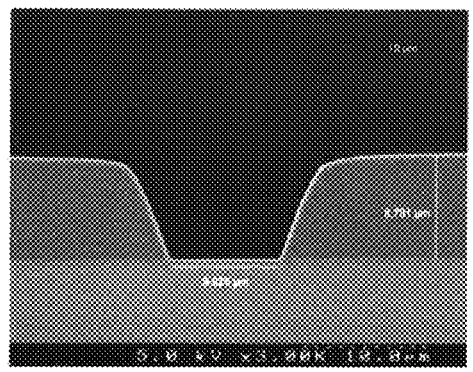
FIG. 1A
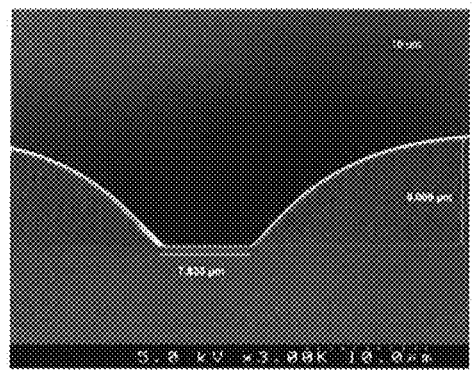
FIG. 1B (CD = -16%)
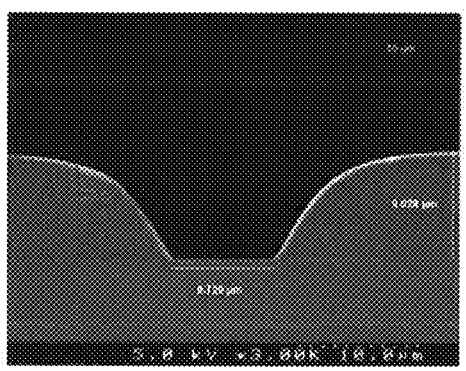
FIG. 1C (CD = -4%)
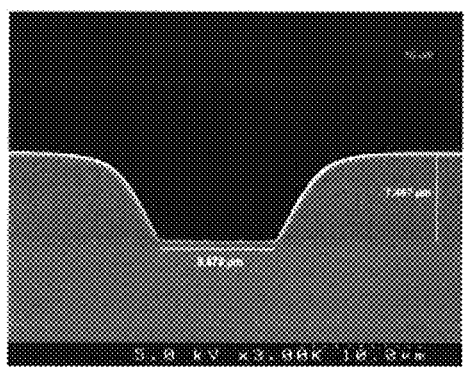
FIG. 1D (CD = -4%)

PHOTOIMAGEABLE COMPOSITIONS CONTAINING THERMAL BASE GENERATORS

CROSS REFERENCE TO RELATED APPLICATIONS

This application claims the benefit of U.S. Provisional Application No. 62/097,706, filed Dec. 30, 2014, which is incorporated herein by reference in its entirety.

BACKGROUND OF THE INVENTION

Field of the Invention

Embodiments in accordance with the present invention relate generally to photoimageable compositions containing certain thermal base generators (TBG) for forming microelectronic and/or optoelectronic devices and assemblies thereof, and more specifically to compositions encompassing polynorbornene (PNB) copolymers having norbornenene-type repeating units and maleic anhydride type repeating units that exhibit improved crosslinking properties during the curing stage after patterning.

Description of the Art

Organic polymer materials are increasingly being used in the microelectronics and optoelectronics industries for a variety of applications. For example, the uses for such organic polymer materials include interlevel dielectrics, redistribution layers (RDL), stress buffer layers, chip stacking and/or bonding, leveling or planarization layers, alpha-particle barriers, passivation layers, among others, in the fabrication of a variety of microelectronic and optoelectronic devices. Where such organic polymer materials are photosensitive, thus self-imageable, and therefore, offer additional advantage of reducing the number of processing steps required for the use of such layers and structures made therefrom. Additionally, such organic polymer materials enable the direct adhesive bonding of devices and device components to form various structures. Such devices include microelectromechanical systems (MEMS), microoptoelectromechanical systems (MOEMS) and the semiconductor device encompassing a complementary metal oxide semiconductor (CMOS) image sensor dam structure, and the like.

While certain of the currently available organic photosensitive compositions are used in some of the aforementioned applications, there is still a need for organic photosensitive compositions which feature improved crosslinking properties after patterning especially in such applications as RDL, chip stacking/bonding and CMOS, where the organic polymer materials retain their photo-patterning integrity by reduced polymer reflow during high temperature curing. In particular, the pattern reflow is found to be significantly increased when using polymers featuring lower glass transition temperature ($T_g$) with flexible epoxy crosslinking agents. The pattern reflow is generally attributed to inefficient crosslinking during the curing stage.

Accordingly, there is still a need to develop self imageable photosensitive polymer compositions which feature efficient crosslinking properties, i.e., feature reduced pattern reflow during curing stage thereby retain high resolution achieved during photo-patterning step. Further, such efficient crosslinking should also improve various other properties, such as, i) maintain pattern integrity after cure, ii) improve bond adhesion, iii) minimize solvent swelling, i.e., improve chemical resistance, and iv) improve mechanical properties, just to name a few.

SUMMARY OF THE INVENTION

It has now been found that by employing one or more thermal base generators (TBG), it is now possible to fabricate a semiconductor device which features hitherto unachievable crosslinking properties, i.e., maintain pattern integrity after cure, features improved bond adhesion and improved solvent swelling, yet can be readily integrated into conventional applications, such as for example, CMOS image sensor (CIS) applications or redistribution layer (RDL) applications, and the like.

Accordingly, there is provided a photoimageable aqueous developable positive tone composition comprising:

a) a polymer having one or more first type of repeating units represented by formula (IA), said first type of repeating unit is derived from a monomer of formula (I):

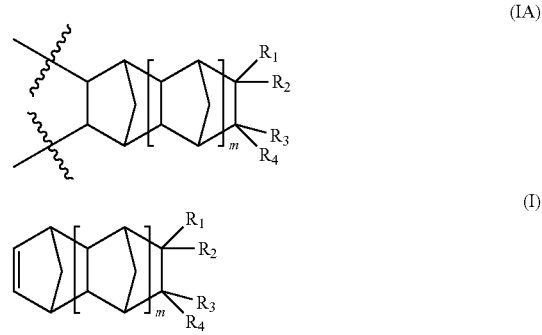

wherein:

m is an integer 0, 1 or 2;

$R_1$, $R_2$, $R_3$ and $R_4$ are the same or different and each independently represents hydrogen, halogen or a hydrocarbyl or halohydrocarbyl group selected from linear or branched ($C_1$-$C_{12}$)alkyl, hydroxy($C_1$-$C_{12}$)alkyl, perfluoro ($C_1$-$C_{12}$)alkyl, ($C_3$-$C_{12}$)cycloalkyl, ($C_6$-$C_{12}$)bicycloalkyl, ($C_7$-$C_{14}$)tricycloalkyl, ($C_6$-$C_{10}$)aryl, ($C_6$-$C_{10}$)aryl($C_1$-$C_6$)alkyl, perfluoro($C_6$-$C_{10}$)aryl, perfluoro($C_6$-$C_{10}$)aryl($C_1$-$C_3$)alkyl, ($C_5$-$C_{10}$)heteroaryl, ($C_5$-$C_{10}$)heteroaryl($C_1$-$C_3$)alkyl, hydroxy, ($C_1$-$C_{12}$)alkoxy, ($C_3$-$C_{12}$)cycloalkoxy, ($C_6$-$C_{12}$)bicycloalkoxy, ($C_7$-$C_{14}$)tricycloalkoxy, ($C_6$-$C_{10}$)aryloxy($C_1$-$C_3$)alkyl, ($C_5$-$C_{10}$)heteroaryloxy($C_1$-$C_3$)alkyl, ($C_6$-$C_{10}$)aryloxy, ($C_5$-$C_{10}$)heteroaryloxy and ($C_1$-$C_6$)acyloxy, —($CH_2$)$_a$—$CO_2R$ or a group of formula (A):

$$—(CH_2)_b—(OCH_2—CH_2)_c—OR \qquad (A);$$

or a group of formula (B):

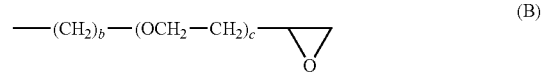

wherein:

a is an integer from 0 to 4 b is an integer 0, 1, 2, 3 or 4;

c is an integer 0, 1, 2, 3 or 4; and

R is hydrogen, linear or branched ($C_1$-$C_6$)alkyl, ($C_5$-$C_8$)cycloalkyl, ($C_6$-$C_{10}$)aryl or ($C_7$-$C_{12}$)aralkyl; and a second type of repeating unit represented by formula (IIA) or (IIB), said second type of repeating unit is derived from a monomer of formula (II):

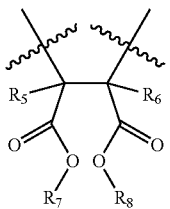

(IIA)

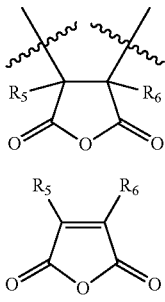

(IIB)

(II)

wherein:

$R_5$, $R_6$, $R_7$ and $R_8$ are each independently of one another hydrogen or a hydrocarbyl or halohydrocarbyl group selected from linear or branched $(C_1-C_9)$alkyl, fluorinated or perfluorinated $(C_1-C_9)$alkyl, $(C_1-C_{12})$alkoxy$(C_1-C_{12})$alkyl and $(C_1-C_{12})$alkoxy$(C_1-C_{12})$alkoxy$(C_1-C_{12})$alkyl; and wherein each of aforementioned groups, where valence is permissible, is optionally substituted with one or more groups selected from linear or branched $(C_1-C_6)$alkyl, $(C_3-C_7)$cycloalkyl, $(C_1-C_6)$perfluoroalkyl, $(C_1-C_6)$alkoxy, $(C_3-C_7)$cycloalkoxy, $(C_1-C_6)$perfluoroalkoxy, halogen, hydroxy, linear or branched hydroxy$(C_1-C_6)$alkykl, acetoxy, phenyl, hydroxyphenyl and acetoxyphenyl;

b) a thermal base generator;
c) a photoactive compound; and
d) a carrier solvent.

BRIEF DESCRIPTION OF THE DRAWINGS

Embodiments in accordance with the present invention are described below with reference to the following accompanying figures and/or images. Where drawings are provided, it will be drawings which are simplified portions of various embodiments of this invention and are provided for illustrative purposes only.

FIG. 1A shows the scanning electron micrograph (SEM) of uncured film of a composition of this invention. FIG. 1B shows the SEM of a film of a composition of this invention cured at 140° C. for 1 hour. FIG. 1C shows the SEM of a film of a composition of this invention cured at 180° C. for 1 hour. FIG. 1D shows the SEM of a film of a composition of this to invention cured at 200° C. for 1 hour.

DETAILED DESCRIPTION

Figure 2A:
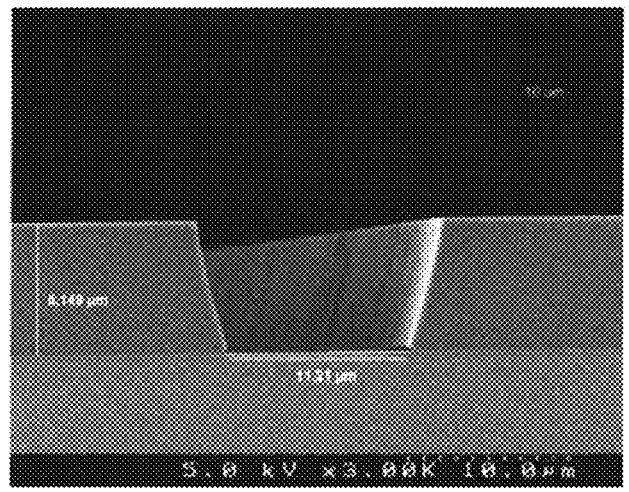
FIG. 2A shows a SEM of uncured film obtained from a comparative example containing a composition without any TBG.

The terms as used herein have the following meanings:

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10, etc.

As used herein, the symbol "〜〜" denotes a position at which the bonding takes place with another repeat unit or another atom or molecule or group or moiety as appropriate with the structure of the group as shown.

As used herein, "hydrocarbyl" refers to a group that contains carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen has been replaced by a halogen. The term perhalocarbyl refers to a hydrocarbyl group where all hydrogens have been replaced by a halogen.

As used herein, the expression "$(C_1-C_6)$alkyl" includes methyl and ethyl groups, and straight-chained or branched propyl, butyl, pentyl and hexyl groups. Particular alkyl groups are methyl, ethyl, n-propyl, isopropyl and tert-butyl. Derived expressions such as "$(C_1-C_4)$alkoxy", "$(C_1-C_4)$thioalkyl" "$(C_1-C_4)$alkoxy$(C_1-C_4)$alkyl", "hydroxy$(C_1-C_4)$alkyl", "$(C_1-C_4)$alkylcarbonyl", "$(C_1-C_4)$alkoxycarbonyl$(C_1-C_4)$alkyl", "$(C_1-C_4)$alkoxycarbonyl", "amino$(C_1-C_4)$alkyl", "$(C_1-C_4)$alkylamino", "$(C_1-C_4)$alkylcarbamoyl$(C_1-C_4)$alkyl", "$(C_1-C_4)$dialkylcarbamoyl$(C_1-C_4)$alkyl" "mono- or di-$(C_1-C_4)$alkylamino$(C_1-C_4)$alkyl", "amino$(C_1-C_4)$alkylcarbonyl" "diphenyl$(C_1-C_4)$alkyl", "phenyl$(C_1-C_4)$alkyl", "phenylcarboyl$(C_1-C_4)$alkyl" and "phenoxy$(C_1-C_4)$alkyl" are to be construed accordingly.

As used herein, the expression "cycloalkyl" includes all of the known cyclic groups. Representative examples of "cycloalkyl" includes without any limitation cyclopropyl, cyclobutyl, cyclopentyl, cyclohexyl, cycloheptyl, cyclooctyl, and the like. Derived expressions such as "cycloalkoxy", "cycloalkylalkyl", "cycloalkylaryl", "cycloalkylcarbonyl" are to be construed accordingly.

As used herein, the expression "$(C_2-C_6)$alkenyl" includes ethenyl and straight-chained or branched propenyl, butenyl, pentenyl and hexenyl groups. Similarly, the expression "$(C_2-C_6)$alkynyl" includes ethynyl and propynyl, and straight-chained or branched butynyl, pentynyl and hexynyl groups.

As used herein the expression "$(C_1-C_4)$acyl" shall have the same meaning as "$(C_1-C_4)$alkanoyl", which can also be represented structurally as "R—CO—," where R is a $(C_1-C_3)$alkyl as defined herein. Additionally, "$(C_1-C_3)$alkylcarbonyl" shall mean same as $(C_1-C_4)$acyl. Specifically, "$(C_1-C_4)$acyl" shall mean formyl, acetyl or ethanoyl, propanoyl, n-butanoyl, etc. Derived expressions such as "($C_1$-$C_4$)acyloxy" and "($C_1$-$C_4$)acyloxyalkyl" are to be construed accordingly.

As used herein, the expression "($C_1$-$C_6$)perfluoroalkyl" means that all of the hydrogen atoms in said alkyl group are replaced with fluorine atoms. Illustrative examples include trifluoromethyl and pentafluoroethyl, and straight-chained or branched heptafluoropropyl, nonafluorobutyl, undecafluoropentyl and tridecafluorohexyl groups. Derived expression, "($C_1$-$C_6$)perfluoroalkoxy", is to be construed accordingly. It should further be noted that certain of the alkyl groups as described herein, such as for example, "($C_1$-$C_6$)alkyl" may partially be fluorinated, that is, only portions of the hydrogen atoms in said alkyl group are replaced with fluorine atoms and shall be construed accordingly.

As used herein, the expression "($C_6$-$C_{10}$)aryl" means substituted or unsubstituted phenyl or naphthyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted to naphthyl" also include any of the possible substituents as further defined herein or one known in the art. Derived expression, "($C_6$-$C_{10}$)arylsulfonyl," is to be construed accordingly.

As used herein, the expression "($C_6$-$C_{10}$)aryl($C_1$-$C_4$)alkyl" means that the ($C_6$-$C_{10}$)aryl as defined herein is further attached to ($C_1$-$C_4$)alkyl as defined herein. Representative examples include benzyl, phenylethyl, 2-phenylpropyl, 1-naphthylmethyl, 2-naphthylmethyl and the like.

As used herein, the expression "heteroaryl" includes all of the known heteroatom containing aromatic radicals. Representative 5-membered heteroaryl radicals include furanyl, thienyl or thiophenyl, pyrrolyl, isopyrroyl, pyrazolyl, imidazolyl, oxazolyl, thiazolyl, isothiazolyl, and the like. Representative 6-membered heteroaryl radicals include pyridinyl, pyridazinyl, pyrimidinyl, pyrazinyl, triazinyl, and the like radicals. Representative examples of bicyclic heteroaryl radicals include, benzofuranyl, benzothiophenyl, indolyl, quinolinyl, isoquinolinyl, cinnolyl, benzimidazolyl, indazolyl, pyridofuranyl, pyridothienyl, and the like radicals.

As used herein, the expression "heterocycle" includes all of the known reduced heteroatom containing cyclic radicals. Representative 5-membered heterocycle radicals include tetrahydrofuranyl, tetrahydrothiophenyl, pyrrolidinyl, 2-thiazolinyl, tetrahydrothiazolyl, tetrahydrooxazolyl, and the like. Representative 6-membered heterocycle radicals include piperidinyl, piperazinyl, morpholinyl, thiomorpholinyl, and the like. Various other heterocycle radicals include, without limitation, aziridinyl, azepanyl, diazepanyl, diazabicyclo[2.2.1]hept-2-yl, and triazocanyl, and the like.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of $C_{1-6}$alkyl, $C_{3-6}$alkenyl, $C_{1-6}$perfluoroalkyl, phenyl, hydroxy, —$CO_2H$, an ester, an amide, $C_1$-$C_6$alkoxy, $C_1$-$C_6$thioalkyl, $C_1$-$C_6$perfluoroalkoxy, —$NH_2$, Cl, Br, I, F, —NH-lower alkyl, and —N(lower alkyl)$_2$. However, any of the other suitable substituents known to one skilled in the art can also be used in these embodiments.

It should be noted that any atom with unsatisfied valences in the text, schemes, examples and tables herein is assumed to have the appropriate number of hydrogen atom(s) to satisfy such valences.

It will be understood that, as used herein, the phrase "microelectronic device" is inclusive of a "micro-optoelectronic device" and an "optoelectronic device". Thus, reference to microelectronic devices or a microelectronic device assemblies are inclusive of optoelectronic devices and micro-optoelectronic devices as well as assemblies thereof. Similarly, microelectromechanical systems (MEMS) include microoptoelectro-mechanical systems (MOEMS).

It will be understood that the term "redistribution layer (RDL)" refers to an electrical signal routing insulation material which features desirable and reliable properties. The term RDL may also be used interchangeably to describe buffer coating layers, such as for example, a stress relief or buffer layer between the solder ball and fragile low-K structure.

As used herein, the terms "polymer composition," "copolymer composition," "terpolymer composition" or "tetrapolymer composition" are used herein interchangeably and are meant to include at least one synthesized polymer, copolymer, terpolymer or tetrapolymer, as well as residues from initiators, solvents or other elements attendant to the synthesis of such polymers, where such residues are understood as not necessarily being covalently incorporated thereto. But some catalysts or initiators may sometimes be covalently bound to a part of the polymeric chain either at the beginning and/or end of the polymeric chain. Such residues and other elements considered as part of the "polymer" or "polymer composition" are typically mixed or co-mingled with the polymer such that they tend to remain therewith when it is transferred between vessels or between solvent or dispersion media. A polymer composition can also include materials added after synthesis of the polymer to provide or modify specific properties of such composition. Such materials include, but are not limited to solvent(s), antioxidant(s), photoinitiator(s), sensitizers and other materials as will be discussed more fully below.

As used herein, the term "modulus" is understood to mean the ratio of stress to strain and unless otherwise indicated, refers to the Young's Modulus or Tensile Modulus measured in the linear elastic region of the stress-strain curve. Modulus values are generally measured in accordance with ASTM method DI708-95. Films having a low modulus are understood to also have low internal stress.

The term "photodefinable" refers to the characteristic of a material or composition of materials, such as a polymer or polymer composition in accordance with embodiments of the present invention, to be formed into, in and of itself, a patterned layer or a structure. In alternate language, a "photodefinable layer" does not require the use of another material layer formed thereover, for example, a photoresist layer, to form the aforementioned patterned layer or structure. It will be further understood that a polymer composition having such a characteristic is generally employed in a pattern forming scheme to form a patterned film/layer or structure. It will be noted that such a scheme incorporates an "imagewise exposure" of the photodefinable material or layer formed therefrom. Such imagewise exposure being taken to mean an exposure to actinic radiation of selected portions of the layer, where non-selected portions are protected from such exposure to actinic radiation.

As used herein, the term "self-imageable compositions" will be understood to mean a material that is photodefinable and can thus provide patterned layers and/or structures after direct image-wise exposure of a film formed thereof followed by development of such images in the film using an appropriate developer.

It will be understood that the terms "dielectric" and "insulating" are used interchangeably herein. Thus reference to an insulating material or layer is inclusive of a dielectric material or layer and vice versa. Further, as used herein, the term "organic electronic device" will be understood to be inclusive of the term "organic semiconductor device" and the several specific implementations of such devices such as the organic field effect transistors (OFETs).

As used herein, the term "thermal base generator" (TBG) and similar terms, such as, "thermally activated base generator" and "thermal initiator" means any material which when exposed to suitable temperature generates one or more bases.

By the term "derived" is meant that the polymeric repeating units are polymerized (formed) from, e.g., polycyclic norbornene-type monomers, in accordance with formulae (I) or maleic anhydride monomers of formula (II) wherein the resulting polymers are formed by 2,3 enchainment of norbornene-type monomers with maleic anhydride monomers in an alternating fashion as shown below:

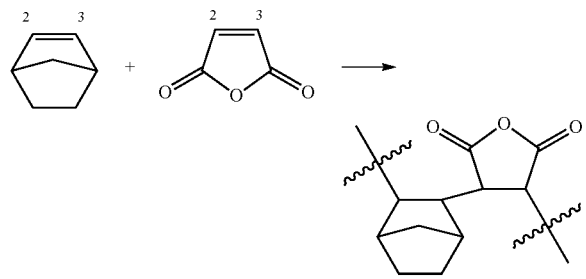

It should be understood that depending upon the monomeric compositions in a given polymer the repeat units may not always be alternating. That is to say, for example, in a copolymer containing other than 50:50 molar ratios of norbornene-type monomers with maleic anhydride monomers, the repeat units are not always alternating but with random blocks of monomers with the higher molar content.

Accordingly, in accordance with the practice of this invention there is provided photoimageable aqueous developable positive tone composition comprising:

b) a polymer having one or more first type of repeating units represented by formula (IA), said first type of repeating unit is derived from a monomer of formula (I):

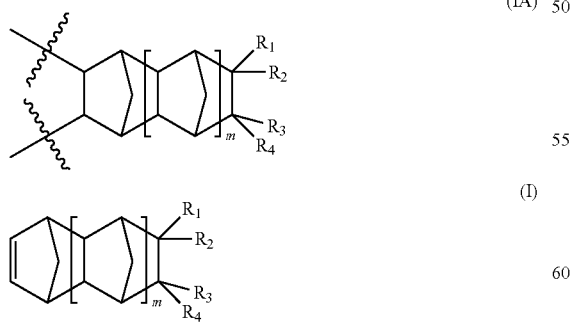

wherein:
m is an integer 0, 1 or 2;
$R_1$, $R_2$, $R_3$ and $R_4$ are the same or different and each independently represents hydrogen, halogen or a hydrocarbyl or halohydrocarbyl group selected from linear or branched $(C_1-C_{12})$alkyl, hydroxy$(C_1-C_{12})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_6)$alkyl, perfluoro$(C_6-C_{10})$aryl, perfluoro$(C_6-C_{10})$aryl$(C_1-C_3)$alkyl, $(C_5-C_{10})$heteroaryl, $(C_5-C_{11})$heteroaryl$(C_1-C_3)$alkyl, hydroxy, $(C_1-C_{12})$alkoxy, $(C_3-C_{12})$cycloalkoxy, $(C_6-C_{12})$bicycloalkoxy, $(C_7-C_{14})$tricycloalkoxy, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy and $(C_1-C_6)$acyloxy, $-(CH_2)_a-CO_2R$ or a group of formula (A):

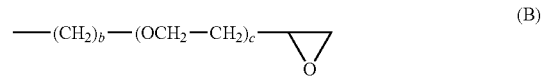

or a group of formula (B):

$$—(CH_2)_b—(OCH_2—CH_2)_c\overset{\triangle}{\underset{O}{}} \qquad (B)$$

wherein:
a is an integer from 0 to 4
b is an integer 0, 1, 2, 3 or 4;
c is an integer 0, 1, 2, 3 or 4; and
R is hydrogen, linear or branched $(C_1-C_6)$alkyl, $(C_5-C_8)$cycloalkyl, $(C_6-C_{10})$aryl or $(C_7-C_{12})$aralkyl; and
a second type of repeating unit represented by formula (IIA) or (IIB), said second type of repeating unit is derived from a monomer of formula (II):

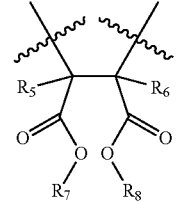

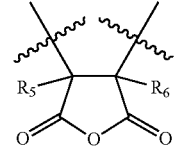

(II)

wherein:
$R_5$, $R_6$, $R_7$ and $R_8$ are each independently of one another hydrogen or a hydrocarbyl or halohydrocarbyl group selected from linear or branched $(C_1-C_9)$alkyl, fluorinated or perfluorinated $(C_1-C_9)$alkyl, $(C_1-C_{12})$alkoxy$(C_1-C_{12})$alkyl and $(C_1-C_{12})$alkoxy$(C_1-C_{12})$alkoxy$(C_1-C_{12})$alkyl; and
wherein each of aforementioned groups, where valence is permissible, is optionally substituted with one or more groups selected from linear or branched $(C_1-C_6)$alkyl, $(C_3-C_7)$cycloalkyl, $(C_1-C_6)$perfluoroalkyl, $(C_1-C_6)$alkoxy, $(C_3-C_7)$cycloalkoxy, $(C_1-C_6)$perfluoroalkoxy, halogen, hydroxy, linear or branched hydroxy$(C_1-C_6)$alkyl, acetoxy, phenyl, hydroxyphenyl and acetoxyphenyl;

b) a thermal base generator;
c) a photoactive compound; and
d) a carrier solvent.

The polymers employed in the photoimageable compositions of this invention can be synthesized by any of the procedures known to one skilled in the art. Generally, such polymers are prepared by free radical polymerization. See for example, U.S. Pat. No. 8,715,900, pertinent portions of which are incorporated herein by reference.

In general, the polymer embodiments in accordance with the present invention encompass the above described one or more of the first distinct type of repeating units of formula (IA) in combination with the repeating unit of formula (IIA) or (IIB), as it will be seen below, various repeating units encompassed by such polymer embodiments are selected to provide properties to such polymer embodiments that are appropriate and desirable for the use for which such embodiments are directed, thus such polymer embodiments are tailorable to a variety of specific applications.

For example, polymer embodiments generally require at least one repeating unit directed to providing imageability. Thus distinct types of repeating units, represented by structural formula (IA) can be used as defined hereinabove, such as, for example $R_1$ being a phenethyl group. However, any of the other functional group which would bring about similar result can also be used instead, for example, a phenyl, benzyl or a substituted phenyl, and the like. Furthermore, the repeat units of formula (IIA), where $R_7$ and/or $R_8$ are hydrogen results in carboxylic acid pendent groups, which are generally useful for participating in a reaction with appropriately selected additives, or other repeating units that can lead to fix a positive-tone image via post develop thermal crosslinking. It should further be noted that one of skill in the art readily appreciates that such polymer compositions containing acidic pendent groups can be made post polymerization by utilizing appropriate monomers. For example, a copolymer containing repeat units of formula (IIB) are formed first, which is subsequently hydrolyzed to form the copolymers containing the carboxylic acid pendent groups by any of the known procedures in the art. Thus certain residual amount of the anhydride monomeric repeat units of formula (JIB) may always be present in the polymer employed herein.

In general, the polymers employed herein are copolymers containing 50:50 molar ratio of repeat units of formula (IA) and a combination of repeat units of formula (IIA) and (IIB). That is to say that, generally, the polymer encompasses equal moles of repeat units of formula (IA) and combined repeat units of formulae (IIA) and (IIB). In other words, when more than one type of norbornene monomers are used to make the polymer used in the composition embodiment of this invention, then the total moles of the norbornene derived repeat units are same as the total moles of the maleic anhydride derived repeat units (i.e., combined moles of formulae (IIA) and (IIB). Thus, generally, the polymers employed herein feature alternating repeat units of norbornene and maleic anhydride units. However, it is also possible that more molar ratios of norbornene type units can be employed to make certain polymers where the excess norbornene repeat units may exist together, such as for example, polymers containing 60:40, 70:30 or 80:20 mole ratio of norbornene to maleic anhydride. Similarly, it is also possible that there may be excess maleic anhydride derived repeat units, such as for example, 40:60, 30:70 or 20:80 mole ratio of norbornene to maleic anhydride. All such combination of polymers can be employed in the composition of this invention.

In general, it has now been found that a polymer containing the monomer repeat unit having an acidic pendent group (generally of formula (IIA), where one or both of $R_7$ and $R_8$ are hydrogen) advantageously provides certain beneficial effect for the photosensitive composition of this invention. Thus, in some embodiments of this invention, the polymer used in the photosensitive composition of this invention contains a monomer repeat unit containing the acid pendent group from about 10 to 50 mol %, and in some other embodiments from 20 to 40 mol %. In some other embodiments the molar percent of the monomer repeat units of formula (IIA), where both $R_7$ and $R_8$ are hydrogen (that means completely ring opened and hydrolyzed), in the polymer may be from about 10 to 50 mol %, from about 20 to 45 mol % and in some other embodiments from about 30 to 40 mol %. In some other embodiments the molar percent of norbornene type monomer repeat units of formula (IA) in the polymer may be from about 50 to 60 mol %.

Accordingly, any of the known monomers of formula (I) can be employed in this aspect of the invention. Representative examples of monomers of formula (I) include the following without any limitations:

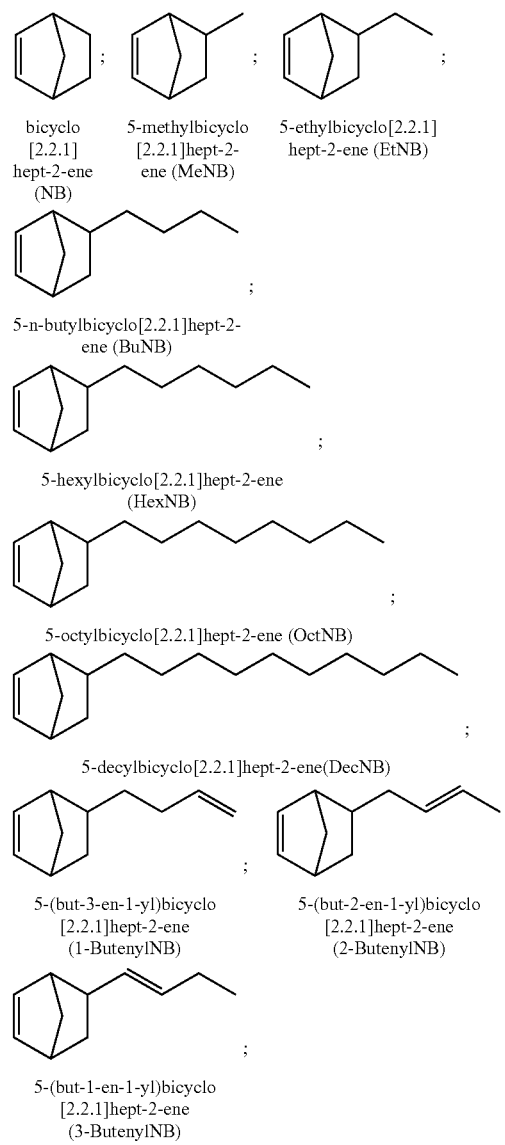

-continued

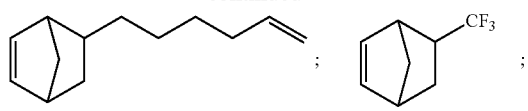 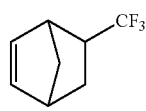

5-(hex-5-en-1-yl)bicyclo[2.2.1]hept-2-ene (HexenylNB)

5-trifluoromethylbicyclo[2.2.1]hept-2-ene ($CF_3NB$)

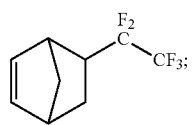

5-perfluoroethylbicyclo[2.2.1]hept-2-ene ($C_2F_5NB$)

5-n-perfluorobutylbicyclo[2.2.1]hept-2-ene ($C_4F_9NB$)

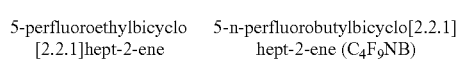

5-perfluorohexylbicyclo[2.2.1]hept-2-ene ($C_6F_{13}NB$)

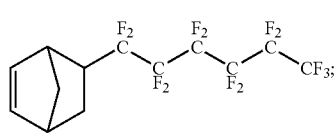

5-perfluorooctylbicyclo[2.2.1]hept-2-ene ($C_8F_{17}NB$)

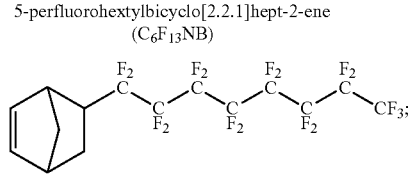

5-perfluorodecylbicyclo[2.2.1]hept-2-ene ($C_{10}F_{21}NB$)

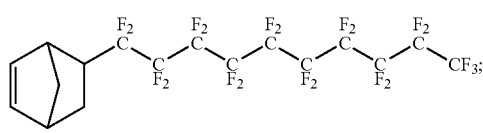

norbornenyl-2-trifluoromethyl-3,3,3-trifluoropropan-2-ol (HFANB)

bicyclo[2.2.1]hept-5-en-2-ylmethyl acetate (MeOAcNB)

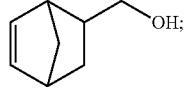

bicyclo[2.2.1]hept-5-en-2-ylmethanol (MeOHNB)

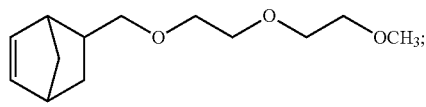

5-((2-(2-methoxyethoxy)ethoxy)methyl)bicyclo[2.2.1]hept-2-ene (NBTON)

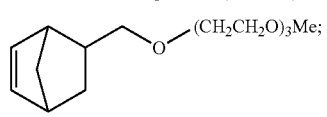

1-(bicyclo[2.2.1]hept-5-en-2-yl)-2,5,8,11-tetraoxadodecane (NBTODD)

-continued

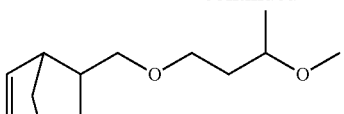

5-(3-methoxybutoxy)methyl-2-norbornene (NB-3-MBM)

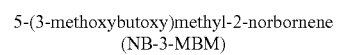

5-(3-methoxypropanoxy)methyl-2-norbornene (NB-3-MPM)

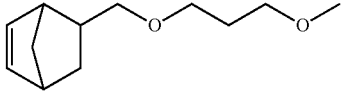

5-(2-(2-ethoxyethoxy)ethyl)bicyclo[2.2.1]hept-2-ene

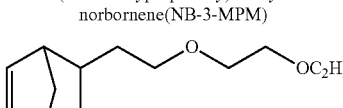

5-(2-(2-(2-propoxyethoxy)ethoxy)ethoxy)bicyclo[2.2.1]hept-2-ene

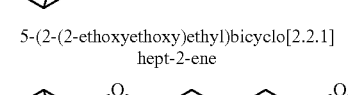 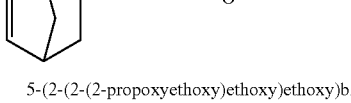

bicyclo[2.2.1]hept-5-ene-2-carboxylic acid (Acid NB)

3-(bicyclo[2.2.1]hept-5-en-2-yl)propanoic acid (NBEtCOOH)

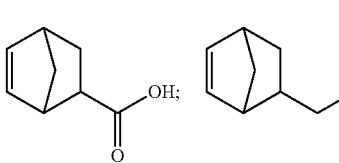

ethyl 3-(bicyclo[2.2.1]hept-5-en-2-yl)propanoate (EPEsNB)

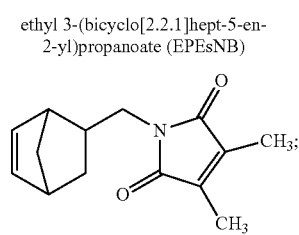

1-(bicyclo[2.2.1]hept-5-en-2-ylmethyl)-3,4-dimethyl-1H-pyrrole-2,5-dione (MeDMMINB)

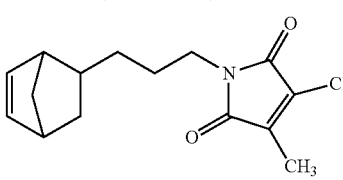

1-(3-(bicyclo[2.2.1]hept-5-en-2-yl)propyl)-3,4-dimethyl-1H-pyrrole-2,5-dione (PrDMMINB)

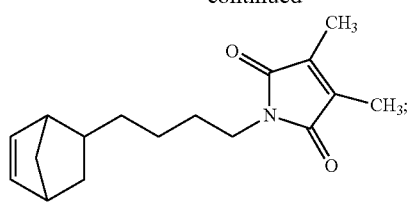

1-(4-(bicyclo[2.2.1]hept-5-en-2-yl)butyl)-
3,4-dimethyl-1H-pyrrole-2,5-dione
(BuDMMINB)

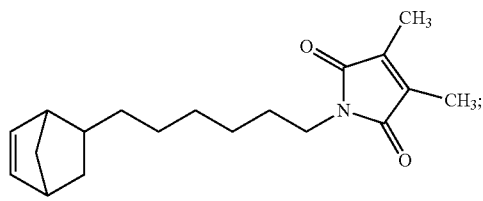

1-(6-(bicyclo[2.2.1]hept-5-en-2-yl)hexyl)-3,4-dimethyl-1H-
pyrrole-2,5-dione (HexDMMINB)

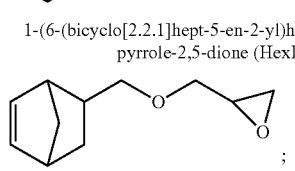

2-((bicyclo[2.2.1]hept-5-en-2-
ylmethoxy)methyl)oxirane
(MGENB)

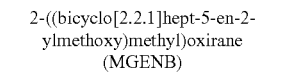

2-(bicyclo[2.2.1]hept-
5-en-2-yl)oxirane

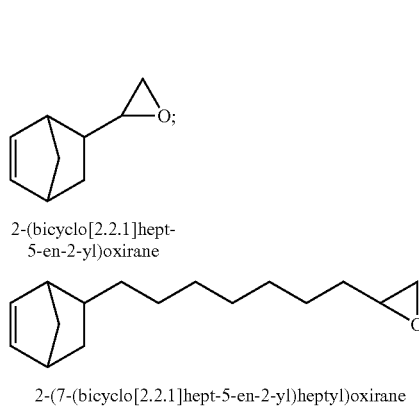

2-(7-(bicyclo[2.2.1]hept-5-en-2-yl)heptyl)oxirane

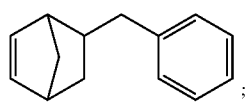

5-benzylbicyclo[2.2.1]hept-
2-ene (BenNB)

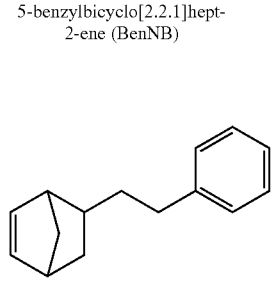

5-phenethylbicyclo[2.2.1]hept-2-
ene (PENB)

2-(bicyclo[2.2.1]hept-5-
en-2-yl)bicyclo[2.2.1]
heptane (also referred to
herein as NBNBA)

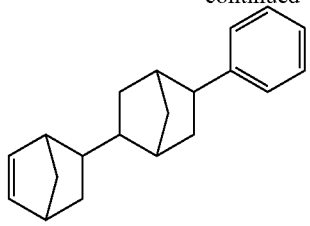

2-(bicyclo[2.2.1]hept-5-en-2-yl)-5-
phenyl-bicyclo[2.2.1]heptane (also
referred to herein as NBNBAPh)

bicyclo[2.2.1]hept-5-
en-2-yl(ethoxy)
dimethylsilane
(NBSiMe₂(OEt))

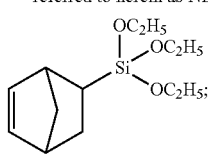

bicyclo[2.2.1]hept-5-en-
2-yl(triethoxy)silane
(TESNB)

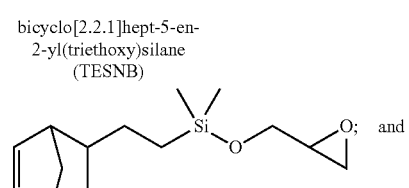

2-(bicyclo[2.2.1]hept-5-en-2-yl)ethyl)dimethyl-
(oxiran-2-ylmethoxy)silane
(NB—SiMe₂O—MGE)

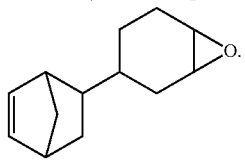

3-(bicyclo[2.2.1]hept-5-en-2-
yl)-7-oxabicyclo[4.1.0]heptane
(NBCHEp)

Turning now to second repeating unit of formula (IIA) or (IIB) to form the polymer for use in the composition of this invention it is contemplated that any maleic anhydride derivative can be used as a monomer, including maleic anhydride itself. Exemplary monomers of such type include but not limited to those selected from the group consisting of:

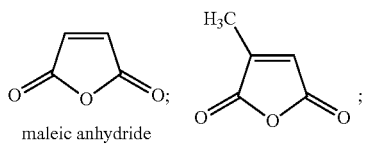

maleic anhydride 2-methyl-maleic
anhydride (3-
methylfuran-2,5-
dione)

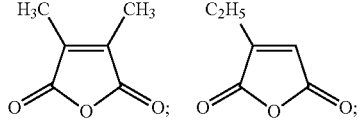

2,3-dimethyl-maleic
anhydride (3-4-
dimethylfuran-2,5-
dione)

2-ethyl-maleic
anhydride (3-
ethylfuran-2,5-
dione)

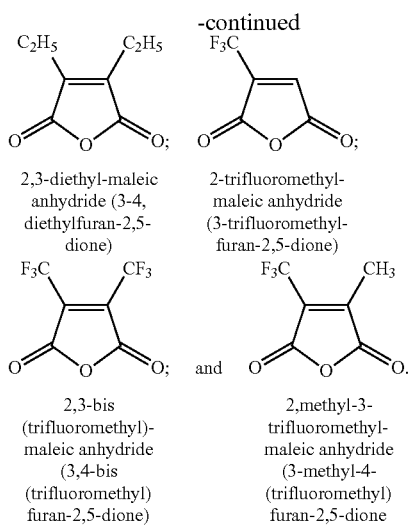

2,3-diethyl-maleic anhydride (3-4, diethylfuran-2,5-dione)

2-trifluoromethyl-maleic anhydride (3-trifluoromethyl-furan-2,5-dione)

2,3-bis(trifluoromethyl)-maleic anhydride (3,4-bis(trifluoromethyl)furan-2,5-dione)

2,methyl-3-trifluoromethyl-maleic anhydride (3-methyl-4-(trifluoromethyl)furan-2,5-dione Again, any of the polymerizable monomer as described herein can be used. Thus, in one of the embodiments the polymer of this invention encompasses one or more repeat units derived from the corresponding monomers selected from the group consisting of:

5-hexylbicyclo[2.2.1]hept-2-ene (HexNB);
5-octylbicyclo[2.2.1]hept-2-ene (OctNB);
5-decylbicyclo[2.2.1]hept-2-ene (DecNB);
5-perfluoroethylbicyclo[2.2.1]hept-2-ene ($C_2F_5NB$);
5-n-perfluorobutylbicyclo[2.2.1]hept-2-ene ($C_4F_9NB$);
5-perfluorohexylbicyclo[2.2.1]hept-2-ene ($C_6F_{13}NB$);
5-benzylbicyclo[2.2.1]hept-2-ene (BenNB);
5-phenethylbicyclo[2.2.1]hept-2-ene (PENB);
ethyl 3-(bicyclo[2.2.1]hept-2-en-2-yl)propanoate (EPEsNB),
bicyclo[2.2.1]hept-5-ene-2-carboxylic acid (Acid NB) and
norbornenylpropanoic acid (NBEtCOOH).

In yet another embodiment the polymer of this invention encompasses one or more repeat units derived from the corresponding monomers selected from the group consisting of:

5-(but-3-en-1-yl)bicyclo[2.2.1]hept-2-ene (1-ButenylNB);
5-(but-2-en-1-yl)bicyclo[2.2.1]hept-2-ene (2-ButenylNB);
5-(but-1-en-1-yl)bicyclo[2.2.1]hept-2-ene (3-ButenylNB);
norbornenyl-2-trifluoromethyl-3,3,3-trifluoropropan-2-ol (HFANB);
1-(3-(bicyclo[2.2.1]hept-5-en-2-yl)propyl)-3,4-dimethyl-1H-pyrrole-2,5-dione (PrDMMINB);
1-(4-(bicyclo[2.2.1]hept-5-en-2-yl)butyl)-3,4-dimethyl-1H-pyrrole-2,5-dione (BuDMMINB);
1-(6-(bicyclo[2.2.1]hept-5-en-2-yl)hexyl)-3,4-dimethyl-1H-pyrrole-2,5-dione (HexDMMINB);
tetraoxadodecanenorbornene (NBTODD);
5-(3-methoxybutoxy)methyl-2-norbornene (NB-3-MBM);
5-(3-methoxypropanoxy)methyl-2-norbornene (NB-3-MPM);
5-((2-(2-methoxyethoxy)ethoxy)methyl)bicyclo[2.2.1]hept-2-ene (NBTON);
2-((bicyclo[2.2.1]hept-5-en-2-ylmethoxy)methyl)oxirane (MGENB);
2-(bicyclo[2.2.1]hept-5-en-2-yl)oxirane; and
2-(7-(bicyclo[2.2.1]hept-5-en-2-yl)heptyl)oxirane.

In a further embodiment, the composition of this invention encompasses a polymer which is a copolymer or a terpolymer containing one or more monomers of formula (I) and at least one monomer of formula (II).

In another embodiment, the composition of this invention encompasses a polymer derived from a monomer of formula (I) wherein m is 0, $R_1$ is phenethyl, $R_2$, $R_3$ and $R_4$ are hydrogen; and a monomer of formula (II) where $R_5$, $R_6$, $R_7$ and $R_8$ are hydrogen.

In yet another embodiment of this invention, the composition encompasses a polymer having one or more repeat units derived from the corresponding monomers selected from the group consisting of:
5-benzylbicyclo[2.2.1]hept-2-ene (BenNB); and
5-phenethylbicyclo[2.2.1]hept-2-ene (PENB).

In a further embodiment of this invention, the composition encompasses a polymer having one or more repeat units derived from the corresponding monomers selected from the group consisting of:
maleic anhydride; and
2-methyl-maleic anhydride.

Non-limiting examples of such copolymers or terpolymers include:
a copolymer containing repeating units derived from 5-phenethylbicyclo[2.2.1]hept-2-ene (PENB) and fully ring opened maleic anhydride repeat unit of formula (IIA) where both $R_7$ and $R_8$ are hydrogen;
a copolymer containing repeating units derived from 5-phenethylbicyclo[2.2.1]hept-2-ene (PENB) and partially ring opened maleic anhydride repeat unit of formula (IIA) where $R_7$ is hydrogen and $R_8$ is methyl;
a copolymer containing repeating units derived from 5-phenethylbicyclo[2.2.1]hept-2-ene (PENB) and partially ring opened maleic anhydride repeat unit of formula (IIA) where $R_7$ is hydrogen and $R_8$ is ethyl;
a copolymer containing repeating units derived from 5-phenethylbicyclo[2.2.1]hept-2-ene (PENB) and partially ring opened maleic anhydride repeat unit of formula (IIA) where $R_7$ is hydrogen and $R_8$ is n-propyl;
a copolymer containing repeating units derived from 5-phenethylbicyclo[2.2.1]hept-2-ene (PENB) and partially ring opened maleic anhydride repeat unit of formula (IIA) where $R_7$ is hydrogen and $R_8$ is n-butyl;
a copolymer containing repeating units derived from 5-phenethylbicyclo[2.2.1]hept-2-ene (PENB) and partially ring opened maleic anhydride repeat unit of formula (IIA) where $R_7$ is hydrogen and $R_8$ is n-octyl; and the like.

The polymers employed to form the compositions of this invention generally exhibit a number average molecular weight ($M_w$) of at least about 2,000. In another embodiment, the polymer employed in the composition of this invention has a $M_w$ of at least about 5,000. In yet another embodiment, the polymer employed in the composition of this invention has a $M_w$ of at least about 8,000. In some other embodiments, the polymer of this invention has a $M_w$ of at least about 10,000. In some other embodiments, the polymer of this invention has a $M_w$ ranging from about 20,000 to 50,000. The weight average molecular weight ($M_w$) of the polymer can be determined by any of the known techniques, such as for example, by gel permeation chromatography (GPC) equipped with suitable detector and calibration standards, such as differential refractive index detector calibrated with narrow-distribution polystyrene standards.

Advantageously, the thermally activated base generator used in the composition embodiments in accordance with the present invention, generates a base upon heating to an effective temperature, where the generated base causes crosslinking of the polymer with other additives, such as crosslinking agents as further described hereinbelow, thereby reducing the reflow of the polymer during curing. Thus, the pattern reflow is minimized during the curing stage of the developed films formed from the compositions of the present invention, and therefore, provides excellent pattern integrity.

Accordingly, any of the known thermally activated base generators can be employed in the compositions of this invention which would bring about the above intended change. Representative examples of such thermally activated base generators include without any limitation a carboxylate salt of an amidine, imidazole, guanidine or a phosphazene derivative. Other thermal base generators include a carboxylic acid or a functional equivalent derivative thereof of an amidine, imidazole, guanidine or phosphazene, which when exposed to a suitable temperature decomposes to release the free base. All of such compounds as single component or mixtures in any combination thereof can be used in the composition of this invention.

An illustrative example of a thermal base generator derived from an imidazole compound is represented by formula (III):

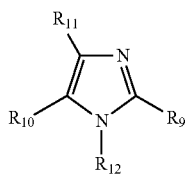

(III)

Where $R_{12}$ is $(C_1-C_6)$alkyloxycarbonyl, $(C_6-C_{10})$aryl$(C_1-C_6)$alkyloxycarbonyl, $(C_6-C_{10})$aryloxycarbonyl and cyano $(C_1-C_6)$alkyl; and $R_9$, $R_{10}$ and $R_{11}$ are the same or different and each independently of one another is selected from hydrogen, linear or branched $(C_1-C_{16})$alkyl, cyano$(C_1-C_{16})$alkyl, cyano$(C_1-C_{16})$alkoxy$(C_1-C_{16})$alkyl, $(C_6-C_{10})$aryl, $(C_6-C_{10})$aryl$(C_1-C_3)$alkyl, perfluoro$(C_6-C_{10})$aryl, perfluoro$(C_6-C_{10})$aryl$(C_1-C_3)$alkyl, $(C_1-C_{12})$alkoxy$(C_1-C_8)$alkyl, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy, $(C_1-C_6)$acyloxy and $(C_1-C_6)$acyloxy.

Representative examples within the scope of compound of formula (III) without any limitation may be enumerated as follows:

1-(tert-butoxycarbonyl)imidazole;
1-(iso-butoxycarbonyl)imidazole;
1-(iso-propoxycarbonyl)imidazole;
1-(n-propoxycarbonyl)imidazole;
1-(methoxycarbonyl)imidazole;
1-(ethoxycarbonyl)imidazole;
1-(2-cyanoethyl)-2-ethyl-4-methyl-imidazole, available commercially as RESICURE® EMI-24-CN from A&C Catalyst, Inc.; and
1-(cyanoethyl)-2-phenyl-4,5-(dicyanoethoxymethyl)imidazole, available commercially as RESICURE® 2-PHICN from A&C Catalyst, Inc.;

Illustrative examples of thermal base generators derived respectively from an amidine compound, a guanidine compound or a phosphazene compound are represented respectively by formulae (IV) to (VI):

(IV)

(V)

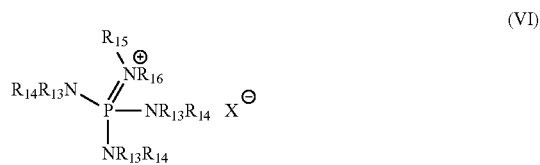

(VI)

Where each $R_{16}$ is independently selected from hydrogen or $(C_1-C_6)$alkyl;

$R_{13}$, $R_{14}$ and $R_{17}$ are the same or different and each independently of one another is selected from hydrogen, a methyl or ethyl group, a linear, branched or cyclic $(C_3-C_{12})$ alkyl group; a linear, branched or cyclic $(C_3-C_{12})$heteroalkyl group having from 1 to 4 heteroatoms independently selected from nitrogen, oxygen or sulfur; a $(C_6-C_{10})$aryl group; a $(C_5-C_{10})$heteroaryl group having from 1 to 4 heteroatoms independently selected from nitrogen, oxygen or sulfur; or where $R_{16}$, $R_{17}$, $R_{13}$ and $R_{14}$ taken together with any intervening atoms and in any combination thereof form one or more cyclic alkyl or heteroalkyl groups;

$R_{15}$ is hydrogen or $(C_1-C_6)$alkyl; and $X^{\ominus}$ is halide, sulfonate, methanesulfonate, trifluoromethanesulfonate or a carboxylate anion.

Specific examples of halide include fluoride, chloride, bromide and iodide. Any of the carboxylate salts can be used in these embodiments, specific examples of which follows.

Any of the amidine compounds within the scope of formula (IV) can be employed as the base generator compounds in the composition embodiments of this invention. Non-limiting representative examples within the scope of compound of formula (IV), i.e., amidine compounds, suitable as thermal base generators in the present invention may be enumerated as follows:

1,8-diazabicyclo[5.4.0]undec-7-ene hydrochloride (DBU HCl) of the formula (IVa):

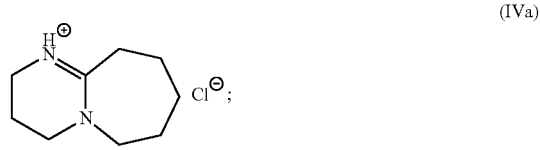

(IVa)

3,4,6,7,8,9-hexahydro-2H-pyrido[1,2-a]pyrimidine hydrochloride of the formula (IVb):

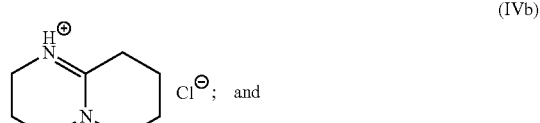

(IVb)

2,3,4,6,7,8-hexahydropyrrolo[1,2-a]pyrimidine hydrochloride of the formula (IVc):

-continued

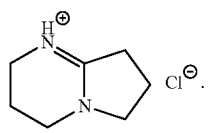 (IVc)

Any of the guanidine compounds within the scope of formula (V) can be employed as the base generator compounds in the composition embodiments of this invention. Non-limiting representative examples within the scope of compound of formula (V), i.e., guanidine compounds, suitable as thermal base generators in the present invention may be enumerated as follows:

1,6,8-triazabicyclo[5.4.0]undec-7-ene hydrochloride of the formula (Va):

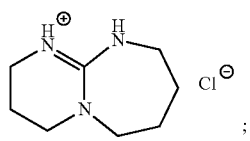 (Va)

1,5,7-triaza-bicyclo[4.4.0]dec-5-ene hydrochloride (TBD HCl) of the formula (Vb):

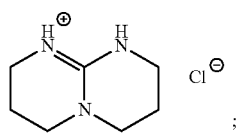 (Vb)

1,5,7-triaza-7-methyl-bicyclo[4.4.0]dec-5-ene hydrochloride (MTBD HCl) of the formula (Vc):

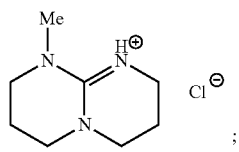 (Vc)

1,5,7-triaza-7-ethyl-bicyclo[4.4.0]dec-5-ene hydrochloride (ETBD HCl) of the formula (Vd):

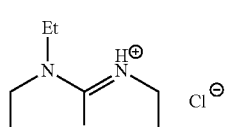 (Vd)

1,5,7-triaza-7-isopropyl-bicyclo[4.4.0]dec-5-ene hydrochloride (ITBD HCl) of the formula (Ve):

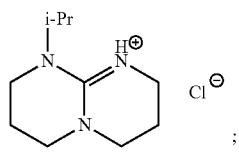 (Ve)

1,2,3,5,6,7-hexahydroimidazo[1,2-a]pyrimidine hydrochloride of the formula (Vf):

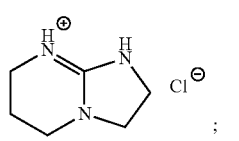 (Vf)

bis(dimethylamino)methaniminium chloride of the formula (Vg):

-continued

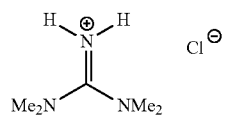 (Vg)

Similarly any of the know phosphazene compounds of formula (VI) that would form a free base when exposed to suitable temperature can be employed in the compositions of this invention.

As disclosed herein the aforementioned amidine, guanidine and phosphazene compounds to when present as quaternary salts any of the known anions can be used to form such salts. That is, any of the inorganic or organic acids, such as hydrochloric acid, hydrofluoric acid, hydrobromic acid, sulfonic acids, phosphonic acids, and the like can be employed. If the acid used is an organic acid, then such representative structures of carboxylates, in their acid form, useful as the carboxylate anion of the TBG embodiments of the present invention are depicted below:

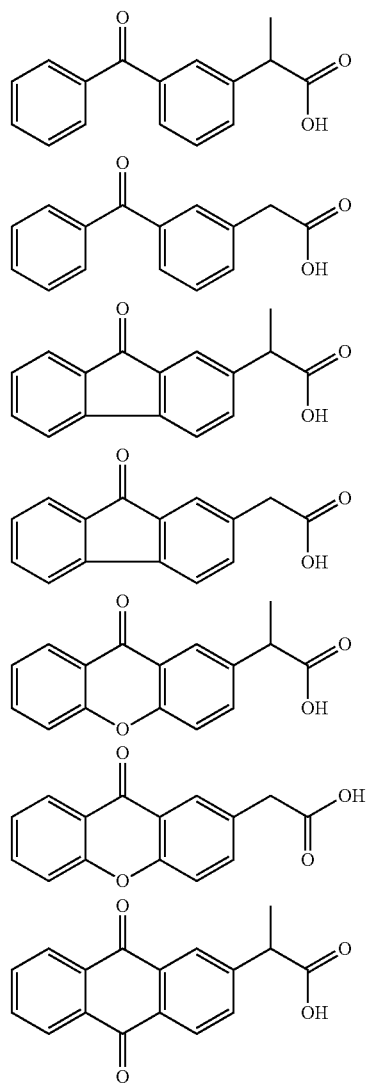

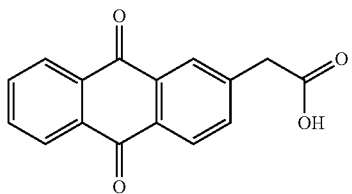

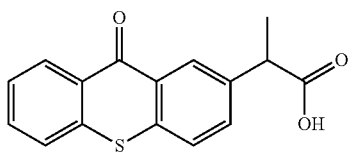

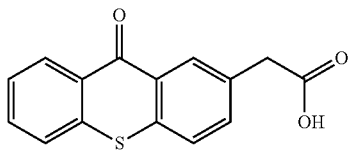

Accordingly, such further exemplary thermal base generators may be enumerated as follows:

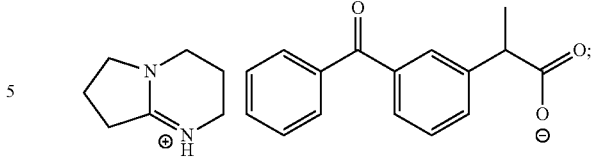

1,5,7-triaza-7-methyl-bicyclo[4.4.0]dec-5-enium 2-(3-benzoylphenyl)propanoate (commercially available as PT-407M)

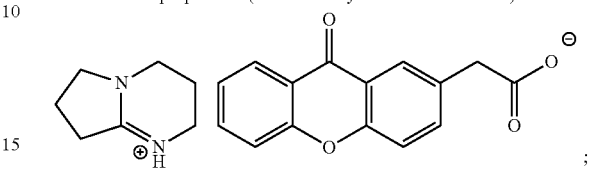

1,5,7-triaza-7-methyl-bicyclo[4.4.0]dec-5-enium 2-(9-oxo-9H-xanthen-2-yl)acetate (commercially available as PT-407Mi)

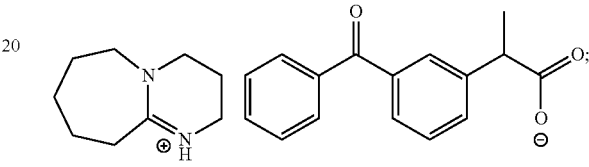

1,5,7-triaza-bicyclo[4.4.0]dec-5-enium 2-(3-benzoylphenyl)propanoate (commercially available as PT-393)

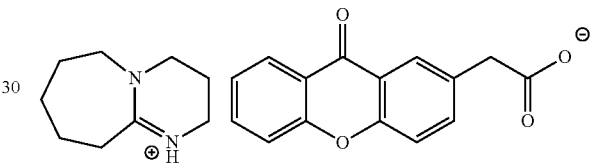

1,5,7-triaza-bicyclo[4.4.0]dec-5-enium 2-(9-oxo-9H-xanthen-2-yl)acetate (commercially available as PT-393i)

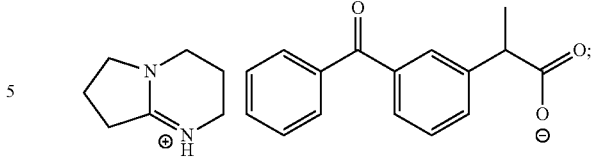

1,6-diazabicyclo[4.3.0]non-5-enium 2-(3-benzoylphenyl)propanoate (commercially available as PT-378)

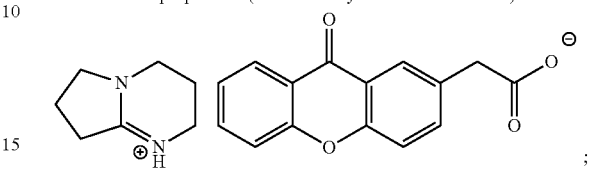

1,6-diazabicyclo[4.3.0]non-5-enium 2-(9-oxo-9H-xanthen-2-yl)acetate (commercially available as PT-378i)

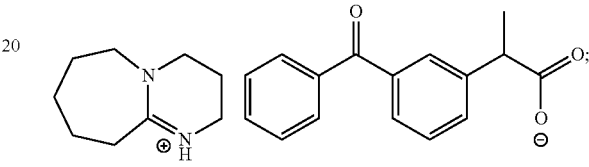

1,8-diazabicyclo[5.4.0]undec-7-enium 2-(3-benzoylphenyl)propanoate (commercially available as PT-407)

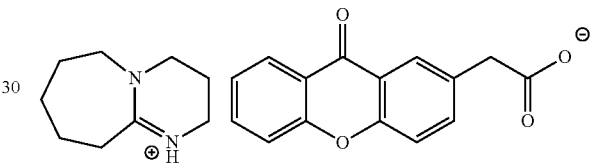

1,8-diazabicyclo[5.4.0]undec-7-enium 2-(9-oxo-9H-xanthen-2-yl)acetate (commercially available as PT-407i)

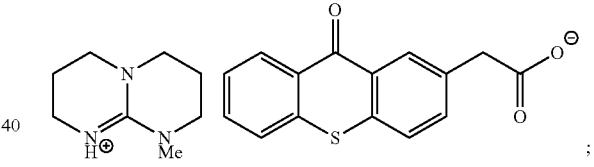

1,5,7-triaza-7-methyl-bicyclo[4.4.0]dec-5-enium 2-(9-oxo-9H-thioxanthen-2-yl)acetate (commercially available as PT-424i)

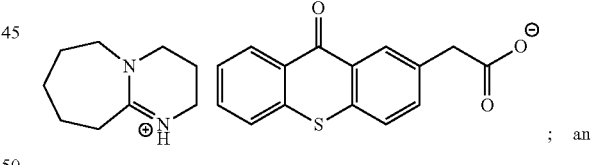

; and 1,8-diazabicyclo[5.4.0]undec-7-enium 2-(9-oxo-9H-thioxanthen-2-yl)acetate (commercially available as PT-423i)

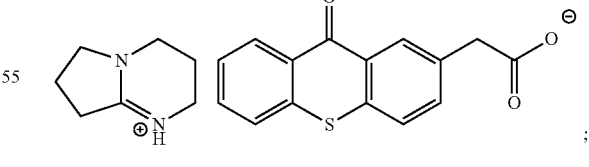

1,6-diazabicyclo[4.3.0]non-5-enium 2-(9-oxo-9H-thioxanthen-2-yl)acetate (commercially available as PT-395i)

The amount of TBG useful in composition embodiments in accordance with the present invention is any amount that generates an effective amount of base to initiate the cross-linking reaction, such amount can thus be referred to as an effective amount. For some embodiments, such amount is from 0.1 to 10 pphr inclusive, based on the weight of the polymer; in other embodiments from 0.5 to 5 pphr inclusive and in still other embodiments, from 1 to 4 pphr inclusive. It will be understood, that for some embodiments of the present invention, it can be advantageous to employ a mixture of TBGs where the effective amount of such mixture is inclusive of the ranges expressed above.

A proprietary amidine salt, K-PURE® CXC-1761, available from King Industries, was also evaluated as a TBG as further discussed hereinbelow. A few of the thermally activated base generators in accordance with the present invention are generally salts having a carboxylate anion. Such salts being characterized by releasing a free base when heated to an effective activation temperature, the free base then having sufficient basicity to cause crosslinking of the additives with the base polymer of the composition embodiments of this invention. The other examples of imidazole compounds of formula (III), amidine compounds of formula (IV), guanidine compounds of formula (V) and phosphazene compounds of formula (VI), as enumerated above, form free bases upon exposure to suitable temperature at which time they cause crosslinking of the additives with the polymer encompassed by the compositions of this invention.

Any of the solvents that can dissolve all of the components of the composition of this invention can be used as a carrier solvent. Representative examples of such solvents include alcohols, such as ethanol, isopropanol, butanols, and the like. Ketone solvents, such as acetone, methyl ethyl ketone (MEK), methyl amyl ketone (MAK), cyclohexanone, cyclopentanone, and the like. Hydrocarbon solvents, such as decane, toluene, p-menthane, and the like. Ester solvents, such as benzyl acetate, ethyl acetate, and the like. Glycol and ether solvents, such as diethylene glycol dimethyl ether, propylene glycol monomethyl ether (PGME), propylene glycol monomethyl ether acetate (PGMEA), and the like. Various other solvents, such as N-methyl-2-pyrrolidone (NMP), gamma-butyrolactone (GBL), N,N-dimethylacetamide, N,N-dimethylformamide (DMF), anisole, methyl 3-methoxypropionate, tetrahydrofuran (THF), 3-ethoxy-1,1,1,2,3,4,4,5,5,6,6,6-dodecafluoro-2-(trifluoromethyl)hexane (HFE-7500), 1,1,1,2,2,3,3,4,4-nonafluoro-4-methoxybutane, 1,1,1,2,2,3,4,4,4-nonafluoro-3-methoxybutane and mixtures in any combination thereof.

As noted, the photoimageable composition of this invention also includes a photoactive compound (PAC). Generally, any of the PAC that brings about the desirable result while exposed to a radiation can be used in this invention. More specifically, the PACs which are suitable in this invention include broadly two classes of compounds which are known in the literature as "photoacid generators" (PAGs) or "photobase generators" (PBGs). The PAGs or the PBGs when exposed to suitable radiation forms respectively an acid or base which initiates the cross-linking of the polymer compositions of this invention.

Generally, the PACs employed in the compositions of this invention are PAGs, which contain a photo active diazoquinone moiety. Such photoactive compounds (PACs) are known to undergo photo-rearrangement when subjected to actinic (or electromagnetic) radiation of suitable wavelength, such as for example 254, 365, 405, or 436 nm depending upon the nature of the PAC employed the wavelength of the radiation can be modified by employing suitable light source. For example, in some embodiments of this invention the PACs employed contain one or more of the diazo-quinone moiety, which can be either a 1,2-naphthoquinonediazide-5-sulfonyl moiety and/or a 1,2-naphthoquinonediazide-4-sulfonyl moiety as represented by structural formulae (VIIa) and (VIIb), respectively:

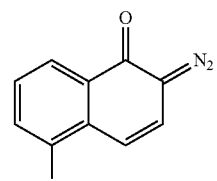

(VIIa)

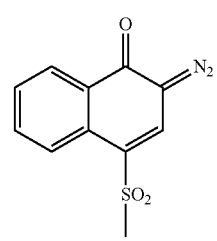

(VIIb)

or a sulfonyl benzoquinone diazide group represented by structural formula (VIIc):

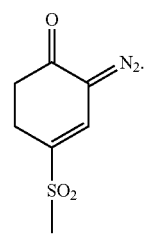

(VIIc)

Generally, the structures of Formulae (VIIa), (VIIb) or (VIIc) are incorporated into the photosensitive composition as an esterification product of the respective sulfonyl chloride (or other reactive moiety) and a phenolic compound, such as one of structures (b-1) through (b-7) shown below, each generally referred to as a photoactive compound or PAC, as discussed above. Thus, any one, or any mixture of two or more of such PACs are combined with the polymer in to forming a positive tone composition embodiment of the present invention. In each of Formulae (b-1) through (b-7), Q represents any of the structures of Formulae (VIIa), (VIIb) or (VIIe). Advantageously, when a portion of a film or a layer of the photosensitive composition is exposed to appropriate actinic or electromagnetic radiation, these esterification products generate a carboxylic acid which enhances the solubility of such exposed portion in an aqueous alkali solution as compared to any unexposed portions of such film. Generally, such photosensitive materials are incorporated into the composition in an amount from 1 to 50 pphr polymer, inclusive, where the specific ratio of the photosensitive material to polymer is a function of the dissolution rate of exposed portions as compared to unexposed portions and the amount of radiation required to achieve a desired dissolution rate differential. Advantageous photosensitive materials useful in embodiments in accordance with the present invention are shown in Formulae (b-1) through (b-7) below; additional useful photosensitive materials are exemplified in U.S. Pat. No. 7,524,594 B2 columns 14-20, pertinent portions of which are incorporated herein by reference:

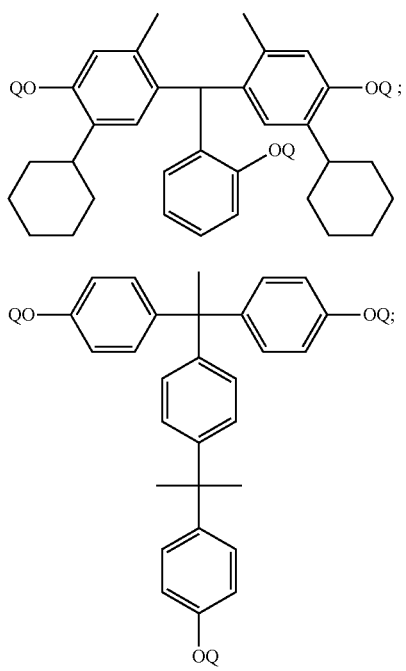
(b-1)

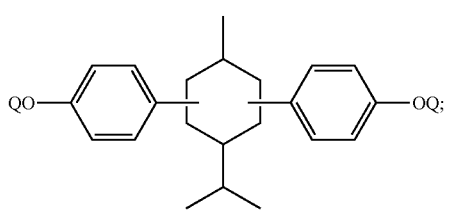
(b-2)

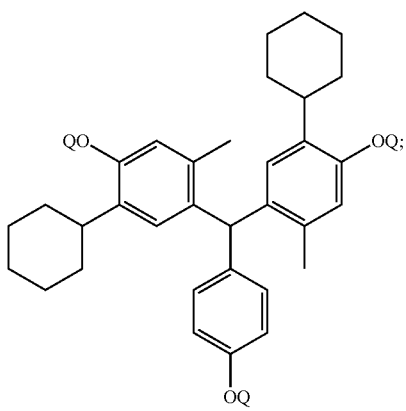
(b-3)

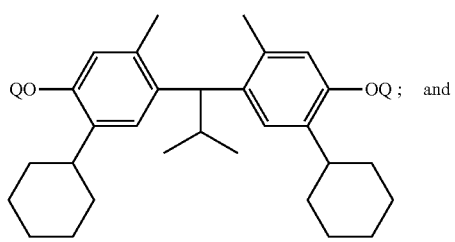
(b-4)

(b-5) and

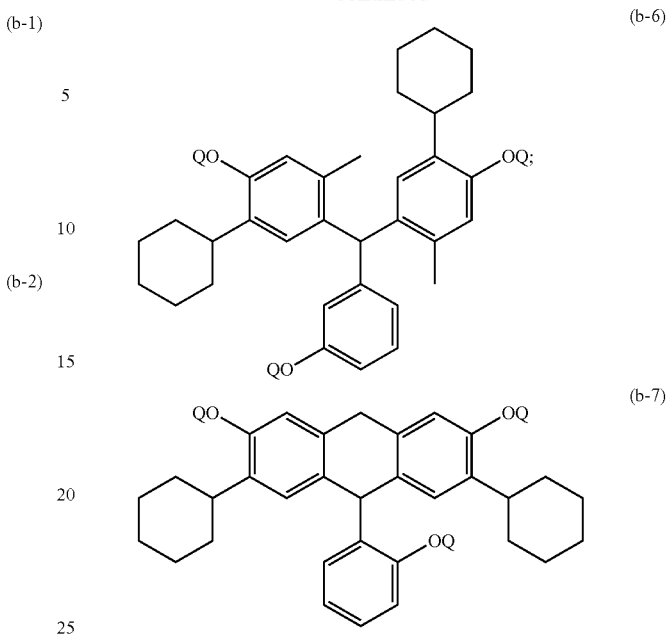
(b-6)

(b-7)

where at least one of Q is a group of the formulae (VIIa), (VIIb) or (VIIc) and any remaining Q is hydrogen. An example of such photoactive compound available commercially include TrisP-3M6C-2(4)-201 and Trisp-2 (b-7, where phenolic Q is hydrogen, i.e., 3,6-dicyclohexyl-7-(((6-diazo-5-oxo-5,6-dihydronaphthalen-1-yl)sulfonyl)oxy)-10-(2-hydroxyphenyl)-9,10-dihydroanthracen-2-yl 6-diazo-5-oxo-5,6-dihydronaphthalene-1-sulfonate) from Toyo Gosei.

As noted, any amount of photoactive compound can be employed in the photosensitive composition of this invention which brings about the desired results as described herein. Generally, as noted above, such amount can range from 1 to 50 parts per hundred parts by mass (pphr) of the polymer, inclusive, as described herein. In some other embodiments such amount can range from 5 to 30 pphr, inclusive.

In addition, various other additives/components can be added to the composition of this invention, which is used for the formation of the photoimageable layer such that its mechanical and other properties can be tailored as desired. Also, other additives can be used to alter the processability, which include increase the stability of the polymer to thermal and/or light radiation. In this regard, the additives can include, but are not limited to, crosslinking agents, antioxidants, adhesion promoters, and the like.

The remaining percentage of the composition not accounted by the thermal base generator, photoacid generator, the polymer (e.g., from about 50% to about 99%) and other additives as described hereinbelow can generally be made up with solvent, such as, but not limited to, MAK, mesitylene, N-methyl-2-pyrrolidinone, propylene carbonate, anisole, cyclohexanone, propyleneglycol monomethyl ether acetate, N-butyl acetate, diglyme, ethyl 3-ethoxypropionate, and combinations thereof.

As noted above, the photosensitive composition of this invention further encompasses one or more compounds having utility as, among other things, adhesion promoters, antioxidants, crosslinking, coupling or curing agent, and the like. Non-limiting examples of such compounds are selected from the group consisting of the following, commercially available materials are indicated by such commercial names.

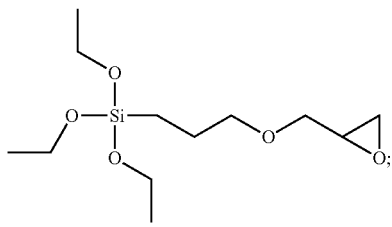

triethoxy(3-(oxiran-2-ylmethoxy)propyl)silane, also commonly known as 3-glycidoxypropyl triethoxysilane (KBE-403 from Shin-Etsu Chemical Co., Ltd.))

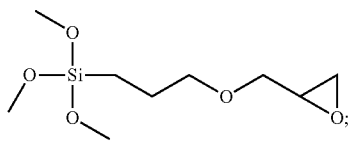

trimethoxy(3-(oxiran-2-ylmethoxy)propyl) silane, also commonly known as 3-glycidoxypropyl triethoxysilane (3-GTS)

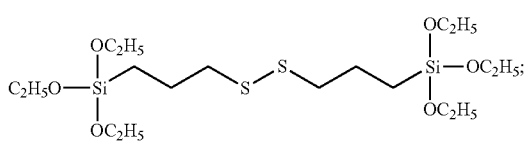

((triethoxysilyl)propyl)disulfide (Si-75 or Si-266 from Evonik)

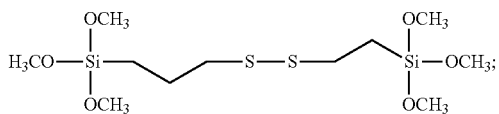

((trimethoxysilyl)propyl)disulfide

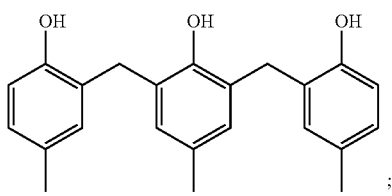

2,2'-((2-hydroxy-5-methyl-1,3-phenylene)bis-(methylene))bis(4-methylphenol) (Antioxidant 80 from TCI Japan)

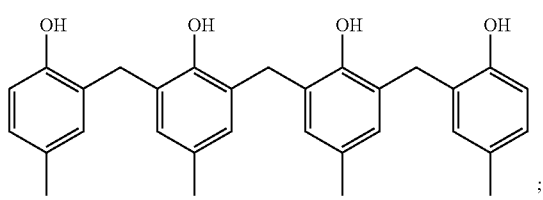

6,6'-methylenebis(2-(2-hydroxy-5-methylbenzyl)-4-methylphenol) (4-PC)

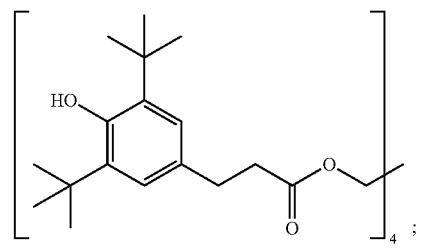

pentaerythritol tetrakis(3-(3,5-di-tert-butyl-4-hydroxyphenyl)propionate) (Irganox 1010 from BASF)

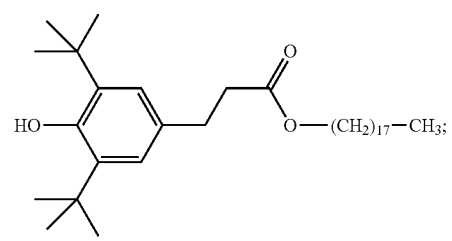

3,5-bis(1,1-dimethylethyl)-4-hydroxy-octadecyl ester benzenepropanoic acid (Irganox 1076 from BASF)

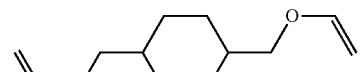

1,4-bis[(ethenyloxy)methyl]-cyclohexane (Cyclohexane Divinyl ether (CHDVE))

Advantageously, it has now been found that the compositions of this invention contain at least one or more of the crosslinking agents. Any of the crosslinking agents known in the literature that would bring about the crosslinking of the polymer with other additives when the base is generated at a desirable temperature during the curing stage can be employed in the embodiments of the present invention. Accordingly, in some embodiments of this invention, the photosensitive composition of this invention, without any limitation, contains one or more epoxy compounds selected from the following:

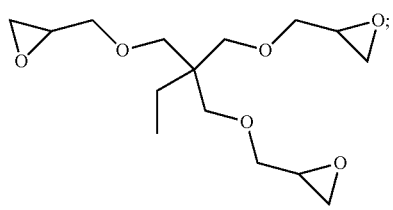

2,2'-((2-ethyl-2-((oxiran-2-ylmethoxy)methyl) propane-1,3-diyl)bis(oxy))bis(methylene))bis-(oxirane), commercially available as Denacol EX321 (Nagase)

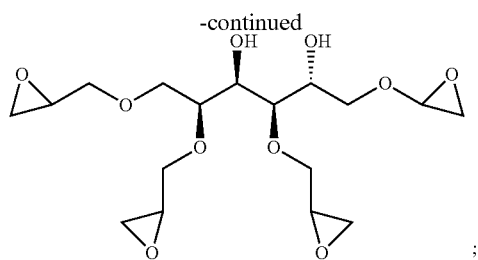

(2R,3R,4R,5S)-1,3,5,6-tetrakis(oxiran-2-ylmethoxy)-
hexane-2,4-diol (also known as tetrakis-o-(oxiranylmethyl)-
D-glucitol) (Denacol EX-614 from Nagase)

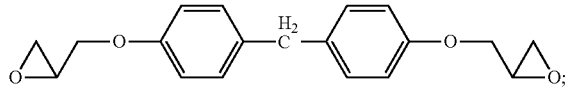

bis(4-(oxiran-2-ylmethoxy)phenyl)methane (EPON 862® from
Momentive Specialty Chemicals Inc.)

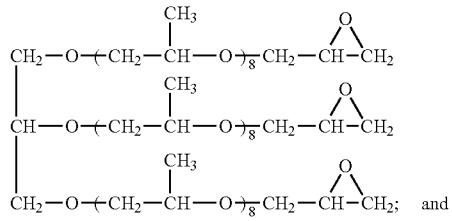

triglycidyl ether of poly(oxypropylene)epoxide
ether of glycerol, commercially available as
Heloxy 84 from Momentive Specialty Chemicals
Inc.;

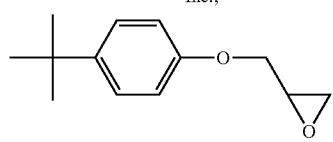

2-((4-(tert-butyl)phenoxy)methyl)oxirane,
commercially available os Heloxy 65
from Momentive Specialty Chemicals
Inc.

Other exemplary cross-linking or crosslinkable materials that can be used as additives in the forming of a photosensitive composition of the present invention include, among others, bisphenol A epoxy resin, bisphenol F epoxy resin, silicone containing epoxy resins or the like, propylene glycol diglycidyl ether, polypropylene glycol diglycidyl ether, glycidyloxypropyltrimethoxysilane, polymethyl (glycidyloxypropyl)cyclohexane or the like; polymers containing oxazoline rings such as 2-methyl-2-oxazoline, 2-ethyl-2-oxazoline, 1,3-bis(2-oxazoline-2-yl)benzene, 1,4-bis(2-oxazoline-2-yl)benzene, 2,2'-bis(2-oxazoline), 2,6-bis(4-isopropyl-2-oxazoline-2-yl)pyridine, 2,6-bis(4-phenyl-2-oxazoline-2-yl)pyridine, 2,2'-isopropylidenebis(4-phenyl-2-oxazoline), (S,S)-(–)-2,2'-isopropylidenebis (4-tert-butyl-2-oxazoline), poly(2-propenyl-2-oxazoline) or the like; N-methylolacrylamide, N-methylol methacrylamide, furfuryl alcohol, benzyl alcohol, salicyl alcohol, 1,2-benzene dimethanol, 1,3-benzene dimethanol, 1,4-benzene dimethanol and resole type phenol resin or mixtures thereof.

Any amount of epoxy compound can be employed in the photosensitive composition of this invention which brings about the desired crosslinking effect of the total composition. Generally, as noted above, such amount can range from 10 to 100 parts per hundred parts by mass (pphr) of the polymer, inclusive, as described herein. In some other embodiments such amount can range from 15 to 80 pphr, inclusive. In some other embodiments such amount can range from 40 to 60 pphr, inclusive. In some embodiments one or more of the epoxy compound as described herein is employed. In another embodiment at least two of the epoxy compounds are employed.

In another aspect of this invention there is further provided a method of forming a film for the fabrication of a microelectronic or optoelectronic device comprising:
coating a suitable substrate with a composition according to this invention to form a film;
patterning the film with a mask by exposing to a suitable radiation;
developing the film after exposure to form a photopattern; and
curing the film by heating to a suitable temperature.

The coating of the desired substrate to form a film with photosensitive composition of this invention can be performed by any of the coating procedures as described herein and/or known to one skilled in the art, such as by spin coating. Other suitable coating methods include without any limitation spraying, doctor blading, meniscus coating, ink jet coating and slot coating. Suitable substrate includes any appropriate substrate as is, or may be used for electrical, electronic or optoelectronic devices, for example, a semiconductor substrate, a ceramic substrate, a glass substrate.

Next, the coated substrate is first softbaked before the curing, i.e., heated to facilitate the removal of residual casting solvent, for example to a temperature from 60° C. to 120° C. for from about 1 to 30 minutes, although other appropriate temperatures and times can be used. In some embodiments the substrate is first softbaked before the curing at a temperature of from about 70° C. to about 100° C. for 2 minutes to 10 minutes. After the heating, the film is generally imagewise exposed to an appropriate wavelength of actinic radiation, wavelength is generally selected based on the choice of the photoactive compound employed in the polymer composition as described hereinabove. However, generally such appropriate wavelength is that produced by a mercury vapor lamp which is from 200 to 450 nm depending upon the type of mercury vapor lamp employed. It will be understood that the phrase "imagewise exposure" means exposing through a masking element to provide for a resulting pattern of exposed and unexposed portion of the film.

After an imagewise exposure of the film formed from the composition in accordance with the present invention, a development process is employed. As noted above, the compositions of this invention function primarily as "positive tone" compositions, that is, the development process removes only exposed portions of the film thus leaving a positive image of the masking layer in the film.

Suitable developers can include aqueous solutions of inorganic alkalis such as sodium hydroxide, potassium hydroxide, sodium carbonate, ammonia, and aqueous solutions of organic alkalis such as 0.26N tetramethylammonium hydroxide (TMAH), ethylamine, triethylamine and triethanolamine. Where an organic alkali is used, generally an organic solvent essentially fully miscible with water is used to provide adequate solubility for the organic alkali. Aqueous solutions of TMAH are well known developer solutions in the semiconductor industry. Suitable developers can also include organic solvents such as propylene glycol methyl ether acetate (PGMEA), 2-heptanone, cyclohexanone, toluene, xylene, ethyl benzene, mesitylene and butyl acetate, among others.

Thus some embodiments of the present invention provide self-imageable films that after imagewise exposure, a resulting image is developed using an aqueous base solution. After the image is developed, the substrate is rinsed to remove excess developer solvent, typical rinse agents are water or appropriate alcohols and mixtures thereof.

After the aforementioned rinsing, the substrate is dried and the imaged film finally cured. That is to say, the image is fixed. In this step, the thermal base generator releases the free base, which facilitates further cross-linking reaction of the remaining polymer material, i.e., unexposed region of the composition. The heating is generally carried out at a desirable temperature, for example, from above 90° C. for a time of from several minutes to one or more hours. Where the remaining layer cross links with the epoxy additive as described herein. Advantageously, it has now been found that such a curing step not only helps in fixing the image, it also reduces the pattern reflow thus enhancing the image resolution. In addition, as it becomes apparent from the examples that follows, the dark film loss (DFL) is also significantly reduced, thus further helping the image resolution. Accordingly in some embodiments the DFL is below 20%. In some other embodiments the DFL is below 15%.

Accordingly, in some embodiments the resulting imagewise film or layer is cured by heating the patterned and developed substrate at a temperature of from about 120° C. to about 250° C. for about 20 minutes to about 240 minutes. In some other embodiments such curing is carried out at a temperature of from about 130° C. to about 200° C. for about 30 minutes to about 180 minutes. In yet some other embodiments such curing is carried out at a temperature of from about 150° C. to about 180° C. for about 60 minutes to about 120 minutes. Finally, in some other embodiments of this invention, the curing is performed at a temperature of from about 130° C. to about 200° C. at an incremental heating ramp of about 5° C./minute and for about 1 to 3 hours. In some other embodiments the pattern reflow is completely absent after curing step, which means that pattern integrity is maintained, thus providing image resolution of about 10 µm. In some other embodiments the image resolution is about 5 µm.

The devices are produced by using embodiments of the photosensitive resin composition of the present invention to form layers which are characterized as having improved mechanical properties, high heat resistance, an appropriate water absorption rate, high transparency, and low permittivity. In addition, such layers generally have an advantageous coefficient of elasticity after curing.

As previously mentioned, exemplary applications for embodiments of the photosensitive compositions in accordance with the present invention include redistribution layer, die attach adhesive, wafer bonding adhesive, insulation films (interlayer dielectric layers), protecting films (passivation layers), mechanical buffer films (stress buffer layers) or flattening films for a variety of semiconductor devices, including printed wiring boards. Specific applications of such embodiments encompass a die-attach adhesive to form a single or multilayer semiconductor device, dielectric film which is formed on a semiconductor device; a buffer coat film which is formed on the passivation film; an interlayer insulation film which is formed over a circuit formed on a semiconductor device.

Advantageously, it has now been found that the photosensitive compositions of this invention may be useful to form adhesive layers for bonding the semiconductor chips to each other, such as in chip-stack applications. For example, a redistribution layer used for such a purpose is composed of a cured product of the photosensitive adhesive composition of the present invention. Surprisingly, it has now been found that although the adhesive layer is a single-layer structure, it not only exhibits sufficient adhesiveness to the substrate but also is free of significant stress resulting due to the curing step. Accordingly, it may now be possible to avoid undesirably thick layer of film encompassing the chip as a laminate. It has been further observed that the laminates formed in accordance with the present invention are reliable in that the relaxation of stress concentration between layers caused by thermal expansion difference or the like can be obtained. As a result, the semiconductor device having low height and high reliability can be obtained. That is, devices with low aspect ratio and low thickness can be obtained. Such semiconductor device becomes particularly advantageous to electronic equipment, which has very small internal volume and is in use while carrying as a mobile device, for example. Even more advantageously, by practice of this invention it may now be possible to form a variety of electronic devices featuring hitherto unachievable level of miniaturization, thinning and light-weight, and the function of the semiconductor device is not easily damaged even if such devices are subject to rugged operations such as swinging or dropping.

Accordingly, in some of the embodiments of this invention there is also provided a cured product obtained by curing the photosensitive composition as described herein. In another embodiment there is also provided an optoelectronic or microelectronic device comprising the cured product of this invention as described herein.

The following examples are detailed descriptions of methods of preparation and use of certain compounds/monomers, polymers and compositions of the present invention. The detailed preparations fall within the scope of, and serve to exemplify, the more generally described methods of preparation set forth above. The examples are presented for illustrative purposes only, and are not intended as a restriction on the scope of the invention. As used in the examples and throughout the specification the ratio of monomer to catalyst is based on a mole to mole basis.

EXAMPLES

The following abbreviations have been used hereinbefore and hereafter in describing some of the compounds, instruments and/or methods employed to illustrate certain of the embodiments of this invention:
PENB—5-phenethylbicyclo[2.2.1]hept-2-ene; MA—maleic anhydride; TrisP—2-3,6-dicyclohexyl-7-(((6-diazo-5-oxo-5,6-dihydronaphthalen-1-yl)sulfonyl)oxy)-10-(2-hydroxyphenyl)-9,10-dihydroanthracen-2-yl 6-diazo-5-oxo-5,6-dihydronaphthalene-1-sulfonate; EPON 862—bis(4-(oxiran-2-ylmethoxy)phenyl)methane; Heloxy 84—triglycidyl ether of poly(oxypropylene)epoxide ether of glycerol; Si-75—((triethoxysilyl)propyl)disulfide; 3-GTS—triethoxy(3-(oxiran-2-ylmethoxy)propyl)silane, also commonly known as 3-glycidoxypropyl triethoxysilane; CXC 1761—a proprietary amidine salt; t-Boc imidazole—1-(tert-butoxycarbonyl)imidazole; 2-PHICN—1-(cyanoethyl)-2-phenyl-4,5-(dicyanoethoxymethyl) imidazole; EMI-24-CN—1-(2-cyanoethyl)-2-ethyl-4-methyl-imidazole; Irganox 1010—pentaerythritol tetrakis (3-(3,5-di-tert-butyl-4-hydroxyphenyl)propionate); PGMEA—propylene glycol monomethyl ether acetate; MAK—methyl amyl ketone; TBG—thermal base generator; phr—parts per hundred parts resin; R. T.—room temperature; LC-MS: liquid chromatography-mass spectroscopy; GPC: gel permeation chromatography; $M_w$—weight average molecular weight; PDI—polydispersity index; phr: parts per hundred parts of resin.

The following examples describe the procedures used for the preparation of various polymers as disclosed herein in the preparation of the compositions of this invention. However, it should be noted that these examples are intended to illustrate the disclosure without limiting the scope thereof.

POLYMER EXAMPLES

The polymers used to form the photosensitive compositions of this invention are generally known in the literature and are prepared in accordance with the well-known literature procedures. See for example, the U.S. Pat. No. 8,715,900, pertinent portions of which are incorporated herein by reference.

Photoimageable Polymer Composition and Imaging Studies

The following Examples illustrate the imageability and thermal crosslinking of the compositions of this invention with a variety of other components as described herein.

Examples 1-4

A fully ring opened copolymer having the monomer composition of 50:50 molar ratio of PENB/MA ring opened with methanol ($M_w$ 10,000, where $R_7$ is hydrogen and $R_8$ is methyl) (100 parts resin) was dissolved in PGMEA having the specific amounts of additives, expressed as parts per hundred resin (pphr) (TrisP-2 as the PAC (25 phr), Si-75 (3 phr) as adhesion promoter, 3-GTS (3 phr); EPON 862 (20 phr) and Heloxy 84 (30 phr) as crosslinking agents were mixed in an appropriately sized amber HDPE bottle with an appropriate amount of solvents. The mixture was rolled for 18 hours to produce a homogeneous solution. Particle contamination was removed by filtering the polymer solution through a 0.45 μm pore polytetrafluoroethylene (PTFE) disc filter under 35 psi pressure, the filtered polymer solution was collected in a low particle HDPE amber bottle and the resulting solution stored at 5° C.

To the above noted composition various TBGs as described hereinabove are added to see the effect of each of the TBG on the performance of the composition.

Compositions thus formed were brought to room temperature and each of which was applied to a 125 mm diameter silicon wafer (thickness: 625 μm) by spin coating. The substrate was then placed on a 100° C. hot plate for 300 seconds, providing about a 11 μm thick polymer film. Each polymer film was then imagewise exposed through a range of exposure energies from 50-730 mJ/cm². Each film was then developed using a puddle development method having about six 30 second immersions in 0.26N TMAH. After the develop process each wafer was rinsed by spraying deionized water for 5 seconds and then dried by spinning at 3000 rpm for 15 seconds. All of the imaged and developed wafers were then cured at 180° C. for 1 hour.

The amount of TBG used in each of Examples 1-4, the photo speed, development time, film thickness, the DFL, and the pattern integrity as measured by the pattern reflow and opening of the lines/vias are summarized in Table 1.

TABLE 1

| | | Photoimage Performance | | | | Pattern Integrity after cure (180° C./1 hour) | |
|---|---|---|---|---|---|---|---|
| Example No. | TBG (phr) | PS (mJ/cm²) | DT (secs) | FT (μm) | DFL (%) | Reflow | Lines/Vias open |
| Example 1 | CXC 1761 (1) | 405 | 25 | 10 | 27 | Yes | Closed |
| Example 2 | t-Boc Imidazole (3) | 400 | 150 | 11 | 13 | No | 5 μm/10 Um |
| Example 3 | 2-PHICN (3) | 405 | 30 | 10.7 | 23 | Yes | Closed |
| Example 4 | EMI-24-CN (3) | 405 | 90 | 10.4 | 14 | No | 5 μm/10 Um |

PS—photo speed;
DT—development time;
FT—film thickness;
DFL—dark film loss;

It is quite evident from the above results that the use of a TBG in accordance with this invention surprisingly improves the photoimage performance and pattern integrity of the composition. That is, much better pattern integrity and resolution were obtained with TBG, which is further improved by increasing the amounts of TBG in Examples 2 to 4. In addition, use of longer development times as in Example 2 and Example 4 also further improved the pattern integrity as evidenced by no reflow in these two examples which also provided much higher resolution of the images as well as very low DFL.

Examples 5-7

The procedures of Examples 1 to 4 were substantially repeated in these Examples 5-7 except for using 3 phr of EMI-24-CN as TBG and further adding 5 phr of Irganox 1010 to the compositions. Three silicon wafers were spin coated with the composition and imaged in accordance with the procedures set forth in Examples 1-4. After developing the images the wafers were cured at three different temperatures: 140° C. for 1 hour (Example 5), 180° C. for 1 hour (Example 6), and 200° C. for 1 hour (Example 7).

The film thickness of each of the samples from Examples 5-7 was about 10 μm. The photo speed employed in each of these Examples 5-7 was about 405 mJ/cm². The development time in each of these Examples 5-7 was about 65 seconds. The degree of film loss (DFL) was measured to be 11% in each of these Examples 5-7. The wafer stress was also measured in each of these Examples 5-7, which was about 14 MPa.

The pattern integrity of the developed films before and after cure was also examined by scanning electron microscopy (SEM). FIG. 1A shows the SEM of uncured film. FIG. 1B shows the SEM of a film cured at 140° C. for 1 hour. FIG. 1C shows the SEM of a film cured at 180° C. for 1 hour. FIG. 1D shows the SEM of a film cured at 200° C. for 1 hour. Also shown in FIGS. 1B to 1D are the critical dimension (CD)

achieved after cure at these respective temperatures. The CD change to smaller than original dimension is designated with a negative sign. Generally, a change of CD less than 10% is considered good. It is evident that CD is much improved at higher cure temperatures of 180° C. and 200° C., where the CD was observed to be −4% (FIGS. 1C and 1D), whereas at 140° C. the CD was measured to be −16%. It is further noted that the pattern integrity is much improved in the presence of Irganox 1010.

Comparative Example 1

The procedure of Examples 1-4 was substantially repeated in this Comparative

Figure 2B:
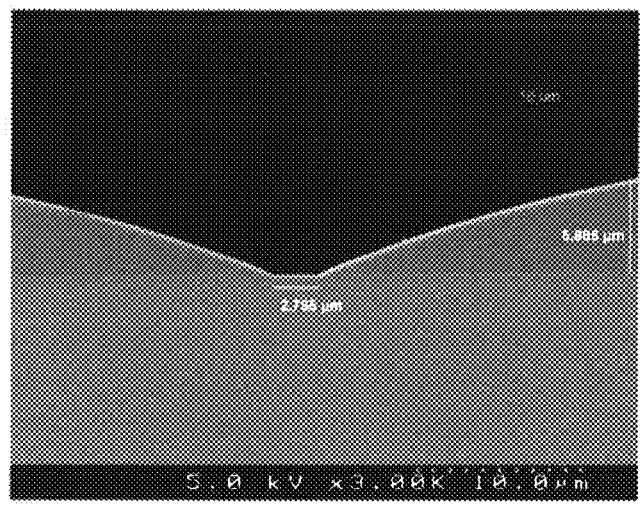
FIG. 2B shows a SEM of the cured film of the comparative example.

Example 1 except that no TBG was used in this composition. FIG. 2A shows the SEM of the developed film before cure. The sample was then cured at 140° C. for 1 hour and the pattern integrity was observed by SEM, which is shown in FIG. 2B. It is evident from these FIGS. 2A and 2B, the Comparative Example 1 provided good imageability with no pattern reflow after TMAH develop, however, after cure even at relatively lower temperature of 140° C., severe pattern reflow in 10 μm line was observed and is quite apparent from FIG. 2B.

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. A photoimageable aqueous developable positive tone composition comprising:
   a) a polymer having one or more first repeating units represented by formula (IA), said first repeating unit is derived from a monomer of formula (I):

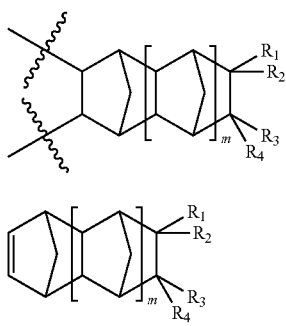

wherein:
   m is an integer 0, 1 or 2;
   $R_1$, $R_2$, $R_3$ and $R_4$ are the same or different and each independently selected from the group consisting of hydrogen, halogen, linear or branched $(C_1-C_{12})$alkyl, hydroxy$(C_1-C_{12})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_6)$alkyl, perfluoro$(C_6-C_{10})$aryl, perfluoro$(C_6-C_{10})$aryl$(C_1-C_3)$alkyl, $(C_5-C_{10})$heteroaryl, $(C_5-C_{10})$heteroaryl$(C_1-C_3)$alkyl, hydroxy, $(C_1-C_{12})$alkoxy, $(C_3-C_{12})$cycloalkoxy, $(C_6-C_{12})$bicycloalkoxy, $(C_7-C_{14})$tricycloalkoxy, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy, $(C_1-C_6)$acyloxy, $-(CH_2)_a-CO_2R$, a group of formula (A):

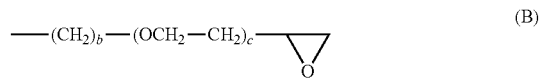

and a group of formula (B):

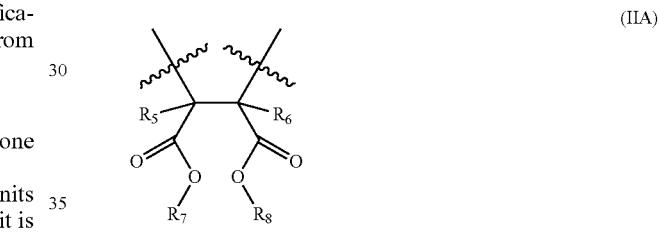

wherein:
   a is an integer from 0 to 4
   b is an integer 0, 1, 2, 3 or 4;
   c is an integer 0, 1, 2, 3 or 4; and
   R is selected from the group consisting of hydrogen, linear or branched $(C_1-C_6)$alkyl, $(C_5-C_8)$cycloalkyl, $(C_6-C_{10})$aryl and $(C_7-C_{12})$aralkyl; and
   a second repeating unit represented by formula (IIA) or (IIB), said second repeating unit is derived from a monomer of formula (II):

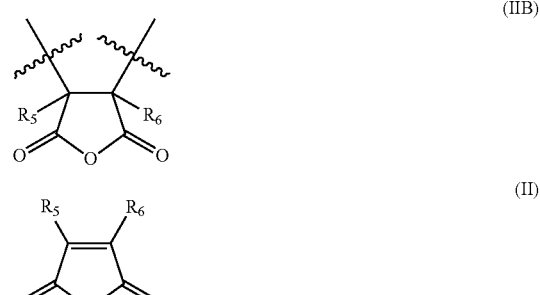

wherein:
   $R_5$, $R_6$, $R_7$ and $R_8$ are each independently of one another selected from the group consisting of hydrogen, linear or branched $(C_1-C_9)$alkyl, fluorinated or perfluorinated $(C_1-C_9)$alkyl, $(C_1-C_{12})$alkoxy$(C_1-C_{12})$alkyl and $(C_1-C_{12})$alkoxy$(C_1-C_{12})$alkoxy$(C_1-C_{12})$alkyl; and
   wherein each of aforementioned groups, where valence is permissible, is optionally substituted with one or more groups selected from the group consisting of linear or branched $(C_1-C_6)$alkyl, $(C_3-C_7)$cycloalkyl, $(C_1-C_6)$perfluoroalkyl, $(C_1-C_6)$alkoxy, $(C_3-C_7)$cycloalkoxy, $(C_1-C_6)$perfluoroalkoxy, halogen, hydroxy, linear or branched hydroxy$(C_1-C_6)$alkyl, acetoxy, phenyl, hydroxyphenyl and acetoxyphenyl;

b) a thermal base generator selected from the group consisting of:
(i) a compound of formula (III):

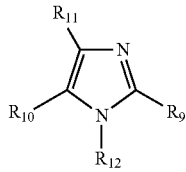

(III)

(ii) a compound of formula (IV):

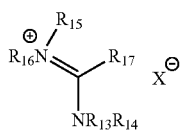

(IV)

(iii) a compound of formula (V):

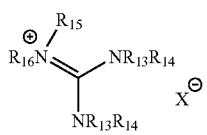

(V)

and
(iv) a compound of formula (VI):

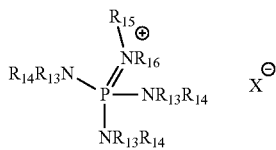

(VI)

wherein
$R_9$, $R_{10}$ and $R_{11}$ are the same or different and each independently of one another selected from the group consisting of hydrogen, linear or branched $(C_1-C_{16})$alkyl, cyano$(C_1-C_{16})$alkyl, cyano$(C_1-C_{16})$alkoxy$(C_1-C_{16})$alkyl, $(C_6-C_{10})$aryl, $(C_6-C_{10})$aryl$(C_1-C_3)$alkyl, perfluoro$(C_6-C_{10})$aryl, perfluoro$(C_6-C_{10})$aryl$(C_1-C_3)$alkyl, $(C_1-C_{12})$alkoxy $(C_1-C_8)$alkyl, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy, $(C_1-C_6)$acyloxy and $(C_1-C_6)$acyloxy;
$R_{12}$ is selected from the group consisting of $(C_1-C_6)$alkyloxycarbonyl, $(C_6-C_{10})$aryl$(C_1-C_6)$alkyloxycarbonyl, $(C_6-C_{10})$aryloxycarbonyl and cyano$(C_1-C_6)$alkyl;
$R_{13}$, $R_{14}$ and $R_{17}$ are the same or different and each independently of one another selected from the group consisting of hydrogen, methyl, ethyl, a linear, branched or cyclic $(C_3-C_{12})$alkyl, a linear, branched or cyclic $(C_3-C_{12})$heteroalkyl having from 1 to 4 heteroatoms independently selected from nitrogen, oxygen and sulfur, $(C_6-C_{10})$aryl and $(C_5-C_{10})$heteroaryl having from 1 to 4 heteroatoms independently selected from nitrogen, oxygen and sulfur;
$R_{15}$ and $R_{16}$ are the same or different and each independently of one another selected from the group consisting of hydrogen and $(C_1-C_6)$alkyl;
or where
$R_{16}$ taken together with the nitrogen atom to which it is attached to and one of $R_{13}$ or $R_{14}$ taken together with the nitrogen atom to which it is attached to and any intervening atoms form a cyclic heteroalkyl group;
$R_{17}$ taken together with the carbon atom to which it is attached to and one of $R_{13}$ or $R_{14}$ taken together with the nitrogen atom to which it is attached to and any intervening atoms form a cyclic heteroalkyl group;
one of $R_{13}$ or $R_{14}$ taken together with the nitrogen atom to which it is attached to and one of adjacent $R_{13}$ or $R_{14}$ taken together with the nitrogen atom to which it is attached to and any intervening atoms form a cyclic heteroalkyl group;
and
$X^\ominus$ is selected from the group consisting of halide, sulfonate, methanesulfonate, trifluoromethanesulfonate and a carboxylate anion;
c) a photoactive compound; and
d) a carrier solvent.

2. The composition of claim 1, wherein m is 0, $R_1$ is phenethyl, $R_2$, $R_3$, $R_4$, $R_5$, $R_6$, $R_7$ and $R_8$ are hydrogen.

3. The composition of claim 1, wherein the polymer comprises one or more repeat units derived from the corresponding monomers selected from the group consisting of:
5-benzylbicyclo[2.2.1]hept-2-ene; and
5-phenethylbicyclo[2.2.1]hept-2-ene.

4. The composition of claim 1, wherein the polymer comprises one or more repeat units derived from the corresponding monomers selected from the group consisting of:
maleic anhydride; and
2-methyl-maleic anhydride.

5. The composition of claim 1, wherein the polymer is selected from the group consisting of:
a copolymer containing repeating units derived from 5-phenethylbicyclo[2.2.1]hept-2-ene and repeat unit of formula (IIA) where $R_5$, $R_6$, $R_7$ and $R_8$ are hydrogen;
a copolymer containing repeating units derived from 5-phenethylbicyclo[2.2.1]hept-2-ene and repeat unit of formula (IIA) where $R_5$, $R_6$, $R_7$ are hydrogen and $R_8$ is methyl.

6. The composition of claim 1, wherein the thermal base generator is of the formula (III):

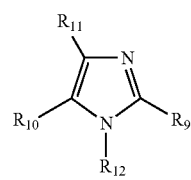

(III)

wherein
$R_{12}$ is selected from the group consisting of tert-butoxycarbonyl, iso-butoxycarbonyl, iso-propoxycarbonyl, n-propoxycarbonyl, methoxycarbonyl, ethoxycarbonyl and cyanoethyl; and $R_9$, $R_{10}$ and $R_{11}$ are the same or different and each independently of one another selected from the group consisting of hydrogen, methyl, ethyl, phenyl and cyanoethoxymethyl.

7. The composition of claim 6, wherein the thermal base generator is selected from the group consisting of:
   1-(tert-butoxycarbonyl)imidazole;
   1-(iso-butoxycarbonyl)imidazole;
   1-(iso-propoxycarbonyl)imidazole;
   1-(n-propoxycarbonyl)imidazole;
   1-(methoxycarbonyl)imidazole;
   1-(ethoxycarbonyl)imidazole;
   1-(2-cyanoethyl)-2-ethyl-4-methyl-imidazole; and
   1-(cyanoethyl)-2-phenyl-4,5-(dicyanoethoxymethyl)imidazole.

8. The composition of claim 6, wherein the thermal base generator is selected from the group consisting of:
   1-(tert-butoxycarbonyl)imidazole;
   1-(2-cyanoethyl)-2-ethyl-4-methyl-imidazole; and
   1-(cyanoethyl)-2-phenyl-4,5-(dicyanoethoxymethyl)imidazole.

9. The composition of claim 6, wherein the thermal base generator is selected from the group consisting of:
   1-(tert-butoxycarbonyl)imidazole; and
   1-(2-cyanoethyl)-2-ethyl-4-methyl-imidazole.

10. The composition of claim 1, wherein the thermal base generator is of the formula (IV):

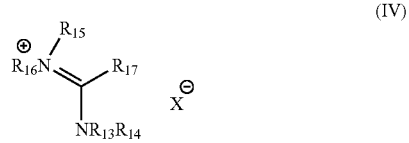

(IV)

wherein
   $R_{16}$ taken together with the nitrogen atom to which it is attached to and $R_{13}$ taken together with the nitrogen atom to which it is attached to and the intervening carbon atom form a cyclic heteroalkyl group, and $R_{17}$ taken together with the carbon atom to which it is attached to and $R_{14}$ taken together with the nitrogen atom to which it is attached to and the intervening carbon atom form a cyclic heteroalkyl group;
   $R_{15}$ is hydrogen; and
   $X^{\ominus}$ is selected from the group consisting of chloride, 2-(3-benzoylphenyl)propanoate, 2-(9-oxo-9H-xanthen-2-yl)acetate and 2-(9-oxo-9H-thioxanthen-2-yl)acetate.

11. The composition of claim 10, wherein the thermal base generator is selected from the group consisting of:
   1,8-diazabicyclo[5.4.0]undec-7-ene hydrochloride;
   3,4,6,7,8,9-hexahydro-2H-pyrido[1,2-a]pyrimidine hydrochloride;
   2,3,4,6,7,8-hexahydropyrrolo[1,2-a]pyrimidine hydrochloride;
   1,6-diazabicyclo[4.3.0]non-5-enium 2-(3-benzoylphenyl) propanoate;
   1,6-diazabicyclo[4.3.0]non-5-enium 2-(9-oxo-9H-xanthen-2-yl)acetate;
   1,8-diazabicyclo[5.4.0]undec-7-enium 2-(3-benzoylphenyl)propanoate;
   1,8-diazabicyclo[5.4.0]undec-7-enium 2-(9-oxo-9H-xanthen-2-yl)acetate;
   1,8-diazabicyclo[5.4.0]undec-7-enium 2-(9-oxo-9H-thioxanthen-2-yl)acetate; and
   1,6-diazabicyclo[4.3.0]non-5-enium 2-(9-oxo-9H-thioxanthen-2-yl)acetate.

12. The composition of claim 1, wherein the thermal base generator is of the formula (V):

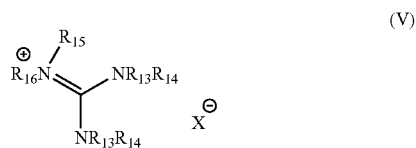

(V)

wherein
   $R_{16}$ taken together with the nitrogen atom to which it is attached to and one of $R_{13}$ or $R_{14}$ taken together with the nitrogen atom to which it is attached to and the intervening carbon atom form a cyclic heteroalkyl group, and one of $R_{13}$ or $R_{14}$ taken together with the nitrogen atom to which it is attached to and one of adjacent $R_{13}$ or $R_{14}$ taken together with the adjacent nitrogen atom to which it is attached to and the intervening carbon atom form a cyclic heteroalkyl group and the remaining $R_{13}$ and $R_{14}$ are the same or different and independently of each other selected from the group consisting of hydrogen, methyl, ethyl, n-propyl and iso-propyl;
   $R_{15}$ is hydrogen; and
   $X^{\ominus}$ is selected from the group consisting of chloride, 2-(3-benzoylphenyl)propanoate, 2-(9-oxo-9H-xanthen-2-yl)acetate and 2-(9-oxo-9H-thioxanthen-2-yl)acetate.

13. The composition of claim 12, wherein the thermal base generator is selected from the group consisting of:
   1,6,8-triazabicyclo[5.4.0]undec-7-ene hydrochloride;
   1,5,7-triaza-bicyclo[4.4.0]dec-5-ene hydrochloride;
   1,5,7-triaza-7-methyl-bicyclo[4.4.0]dec-5-ene hydrochloride;
   1,5,7-triaza-7-ethyl-bicyclo[4.4.0]dec-5-ene hydrochloride;
   1,5,7-triaza-7-isopropyl-bicyclo[4.4.0]dec-5-ene hydrochloride;
   1,2,3,5,6,7-hexahydroimidazo[1,2-a]pyrimidine hydrochloride;
   bis(dimethylamino)methaniminium chloride;
   1,5,7-triaza-7-methyl-bicyclo[4.4.0]dec-5-enium 2-(3-benzoylphenyl)propanoate;
   1,5,7-triaza-7-methyl-bicyclo[4.4.0]dec-5-enium 2-(9-oxo-9H-xanthen-2-yl)acetate;
   1,5,7-triaza-bicyclo[4.4.0]dec-5-enium 2-(3-benzoylphenyl)propanoate;
   1,5,7-triaza-bicyclo[4.4.0]dec-5-enium 2-(9-oxo-9H-xanthen-2-yl)acetate; and
   1,5,7-triaza-7-methyl-bicyclo[4.4.0]dec-5-enium 2-(9-oxo-9H-thioxanthen-2-yl)acetate.

14. The composition of claim 1, wherein the thermal base generator is of the formula (VI):

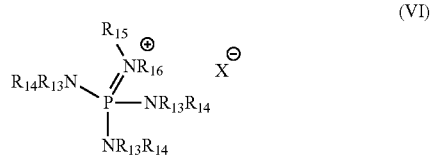

(VI)

wherein
R$_{16}$ is hydrogen or (C$_1$-C$_6$)alkyl;
R$_{13}$ and R$_{14}$ are the same or different and each independently of one another is selected from hydrogen, a methyl or ethyl group, a linear, branched or cyclic (C$_3$-C$_{12}$)alkyl group; a linear, branched or cyclic (C$_3$-C$_{12}$)heteroalkyl group having from 1 to 4 heteroatoms independently selected from nitrogen, oxygen or sulfur; a (C$_6$-C$_{10}$)aryl group; a (C$_5$-C$_{10}$) heteroaryl group having from 1 to 4 heteroatoms independently selected from nitrogen, oxygen or sulfur; or where R$_{16}$ taken together with R$_{13}$ and R$_{14}$ and any intervening atoms form a cyclic heteroalkyl group and one of R$_{13}$ or R$_{14}$ taken together with one of R$_{13}$ or R$_{14}$ on the adjacent nitrogen atom and any intervening atoms form a cyclic heteroalkyl group and the remaining R$_{13}$ and R$_{14}$ are hydrogen;
R$_{15}$ is hydrogen or (C$_1$-C$_6$)alkyl; and
X$^\ominus$ is halide, sulfonate, methanesulfonate, trifluoromethanesulfonate or a carboxylate anion.

15. The composition of claim 1, wherein the photoactive compound comprises a 1,2-naphthoquinonediazide-5-sulfonyl moiety or a 1,2-naphthoquinonediazide-4-sulfonyl moiety as represented by structural formulae (VIIa) and (VIIb), respectively:

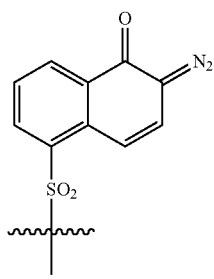

(VIIa)

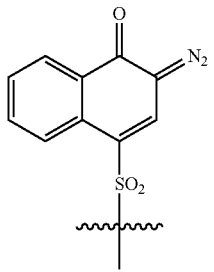

(VIIb)

or a sulfonyl benzoquinone diazide group represented by structural formula (VIIc):

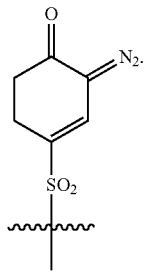

(VIIc)

16. The composition of claim 15, wherein the photoactive compound is selected from the group consisting of:

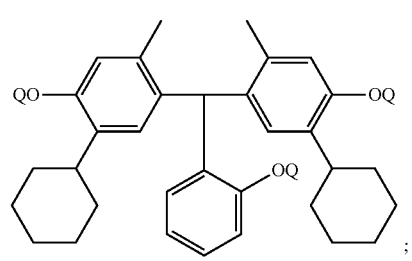

(b-1)

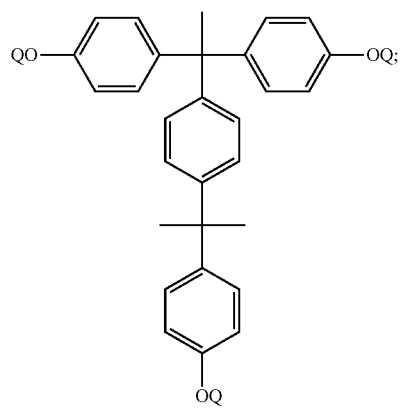

(b-2)

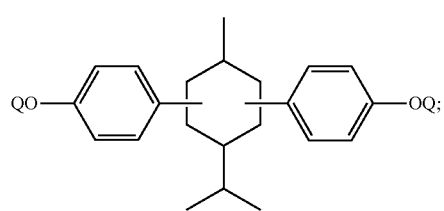

(b-3)

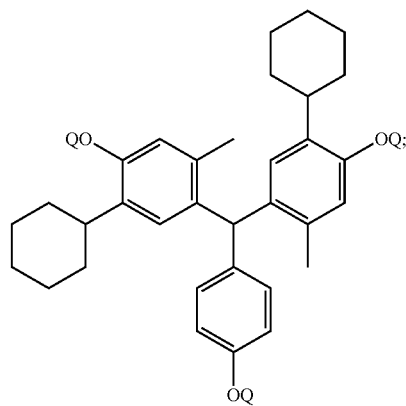

(b-4)

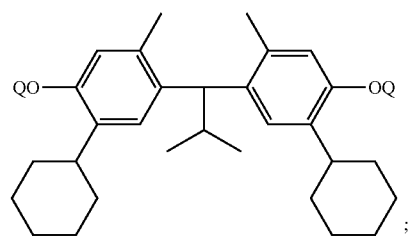

(b-5)

(b-6)

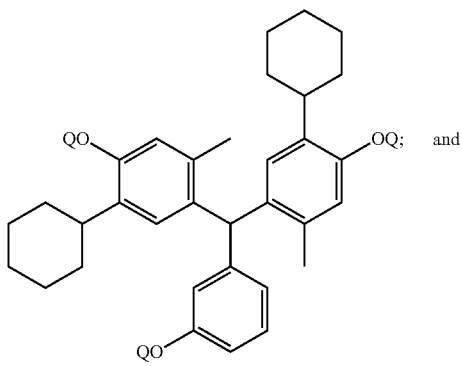

(b-7)

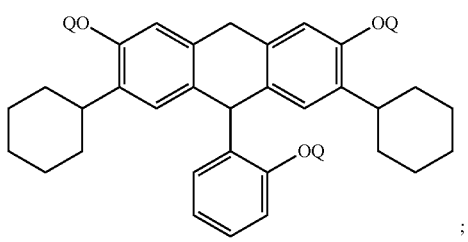

wherein at least one of Q is a group of formula (VIIa) or (VIIb):

(VIIa)

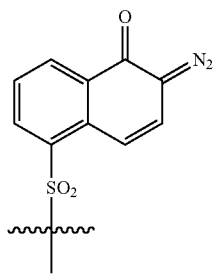

(VIIb)

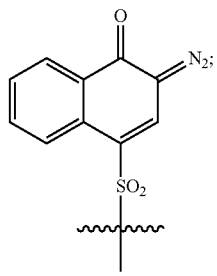

and the remaining Q is hydrogen.

17. The composition of claim 1 further comprises one or more additives selected from the group consisting of:
- a crosslinking agent;
- an antioxidant; and
- an adhesion promoter.

18. The composition of claim 17, wherein the crosslinking agent is selected from:
- bis(4-(oxiran-2-ylmethoxy)phenyl)methane;
- triglycidyl ether of poly(oxypropylene)epoxide ether of glycerol; and
- 2-((4-(tert-butyl)phenoxy)methyl)oxirane.

19. The composition of claim 17, wherein the antioxidant is pentaerythritol tetrakis(3-(3,5-di-tert-butyl-4-hydroxyphenyl)propionate).

20. The composition of claim 17, wherein the adhesion promoter is selected from the group consisting of:

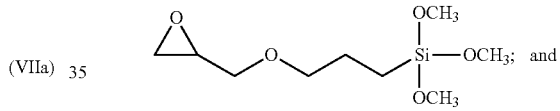

trimethoxy(3-(oxiran-2-ylmethoxy)propyl)silane

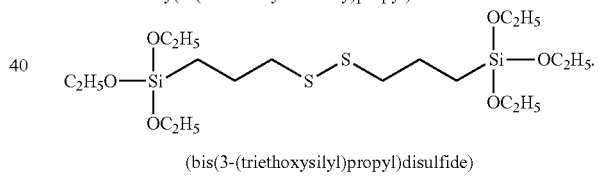

(bis(3-(triethoxysilyl)propyl)disulfide)

* * * * *